(12) United States Patent
Adachi et al.

(10) Patent No.: US 7,977,875 B2
(45) Date of Patent: Jul. 12, 2011

(54) LIGHT EMITTING DISPLAY

(75) Inventors: Masaya Adachi, Hitachi (JP); Toshihiro Sato, Mobara (JP); Naoki Tokuda, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 309 days.

(21) Appl. No.: 12/323,178

(22) Filed: Nov. 25, 2008

(65) Prior Publication Data

US 2009/0115688 A1    May 7, 2009

Related U.S. Application Data

(63) Continuation of application No. 10/887,299, filed on Jul. 7, 2004, now Pat. No. 7,511,420.

(30) Foreign Application Priority Data

Jul. 9, 2003 (JP) ................................. 2003-194469

(51) Int. Cl.
*H01J 1/62* (2006.01)
(52) U.S. Cl. ...................................... 313/506; 313/498
(58) Field of Classification Search ............ 313/498–512
See application file for complete search history.

(56) References Cited

U.S. PATENT DOCUMENTS 6,528,820 B1    3/2003    Yamazaki et al. .............. 257/66

FOREIGN PATENT DOCUMENTS

| JP | 4-328298 | 11/1992 |
| JP | 7-240277 | 9/1995 |
| JP | 11-329742 | 11/1999 |
| JP | 2002-270365 | 9/2002 |

OTHER PUBLICATIONS

Miyaguchi, et al., "Organic LED Fullcolor Passive-Matrix Display", Journal of the SID, 7/3, pp. 221-226 (1999).
Shimoda, at al., "Multicolor Pixel Patterning of Light-Emitting Polymers by Ink-Jet Printing" SID 99 Digest, 376 (1999).

*Primary Examiner* — Joseph L Williams
(74) *Attorney, Agent, or Firm* — Antonelli, Terry, Stout & Kraus, LLP.

(57) ABSTRACT

A light emitting display includes light-emitting devices in which unnecessary layers for the emission operation of the light-emitting device are removed in an emission region, and in a case where a wavelength of a light, of which an interference intensity to the light emitted from an emissive layer constituting the light-emitting device becomes a maximum value at 0 degree of a viewing angle, is λimax and a wavelength of the light becoming a maximum in a light intensity in relation to the light emitted from the emissive layer is λemax, a relationship of λimax<λemax is satisfied, obtaining a light emitting display with a little variation in color over a wide range of viewing angles.

6 Claims, 20 Drawing Sheets

ONE EXAMPLE OF EMISSION SPECTRUM RELATING
TO THE PRESENT INVENTION

WAVELENGTH DEPENDENCY OF
INTERFERENCE INTENSITY IN THE
PRESENT INVENTION

WAVELENGTH DEPENDENCY OF
INTERFERENCE INTENSITY IN THE
PRESENT INVENTION

ONE EXAMPLE OF ORGANIC LIGHT
EMITTING DIODE IN CONVENTIONAL
TECHNOLOGY

ONE EXAMPLE OF LIGHT EMITTING
DISPLAY IN CONVENTIONAL TECHNOLOGY

ONE EXAMPLE OF EMISSION SPECTRUM OF GREEN PIXEL IN CONVENTIONAL TECHNOLOGY

VIEWING ANGLE DEPENDENCY OF
CHROMATICITY IN CONVENTIONAL
TECHNOLOLGY

VIEWING ANGLE DEPENDENCY OF INTERFERENCE INTENSITY OF GREEN PIXEL IN CONVENTIONAL TECHNOLOGY

LIGHT EMITTING DISPLAY

CROSS-REFERENCE TO THE RELATED APPLICATIONS

This application is a continuation of application Ser. No. 10/887,299 filed Jul. 7, 2004, the entire contents of which are incorporated herein by reference. This application also claims the benefit of priority under 35 USC 119 to Japanese Patent Application No. 2003-194469 filed Jul. 9, 2003, the entire contents of which are incorporated herein by reference.

BACKGROUND OF THE INVENTION

1. Field of the Invention

The present invention relates to a light emitting display that controls a light emitting operation of light emitting devices positioned in a matrix form to make a display, more particularly, to a light emitting display that has light emitting devices, such as organic light-emitting diode devices of a structure in which thin films having a thickness on the order of a light wavelength or below are laminated, or the like.

2. Description of the Related Art

An organic light-emitting diode device converts electric energy to optical energy to emit light by injecting holes and electrons into an emissive layer made up of an organic thin film. The light-emitting type display having the organic light-emitting diode device as a light emitting device (referred to as an "OLED display" hereinafter) differs from a non-emissive type display represented by a liquid crystal display in that it is thin and lightweight since it is a self-emissive type, requiring no light source such as back light or the like. Furthermore, the OLED display is characterized in that it has a wide viewing angle and is quick in response.

It is known that an organic light-emitting diode 70 includes: a transparent electrode 200 that is formed on a transparent substrate 6 and functions as an anode; a reflective electrode 300 that has a metal which functions as a cathode; and an organic thin film 100 of a three-layer structure having an electron transporting layer 101, an emissive layer 102 and a hole transporting layer 103, which are in turn stacked between the foregoing electrodes from the cathode side, as shown in FIG. 16. The thickness of the films that constitute the organic light-emitting diode device 70 is, generally, on the order of a wavelength of light, from tens to hundreds of nm or below, and the reflective electrode is specular. Therefore, the light emitted from the emissive layer is influenced by interference. There is a problem with the organic light-emitting diode device 70 that light 2000 which actually travels toward an viewer 1000 changes in emission spectrum and then in color due to a viewing angle. An inorganic electroluminescent device also experiences a similar problem.

A light emitting device that is structured to scatter light to cope with the above problem is disclosed in JP-A-11-329742 and JP-A-2002-270365. These documents describe that color variations relative to a viewing angle caused by interference is significantly reduced because the light emitted from the device is scattered by a light scatterer, and the light traveling in various directions and of different phases are mixed.

A device that significantly reduces color variations relative to a viewing angle which is caused by light interference is also disclosed in JP-A-4-328295. It is structured such that the film of an electron transporting layer is so thick that it includes the secondary maximum value of a film thickness luminance attenuation characteristic, and its amplitude generates luminance exceeding its converging luminance value. For the device, attention is focused on the interference occurring due to the phase difference between the light traveling directly to the viewer and that traveling to the viewer after being reflected on an electrode of the back side amount of the light emitted from the emissive layer, and a condition is set based on the film thickness luminance attenuation characteristic of the electron transporting layer.

An organic light-emitting diode device that utilizes the interference effect is also disclosed in Japanese Patent No. 2846571, wherein an interface between a transparent electrode and a substrate, that between the transparent electrode and a foundation layer of high refractivity, or that between the transparent electrode and a foundation layer of low refractivity is dealt as reflectivity properties and color purity of emission color is improved by controlling of the optical thickness from the anode to cathode.

Typically, a drive type of the OLED display includes an active matrix drive that has a switching element such as a thin film transistor (also referred to as "TFT" hereinafter), and a passive matrix drive in which an electrode constituting an organic light-emitting diode device is directly connected to a scanning line and a data line for driving.

A typical pixel drive circuit of the active matrix drive OLED display has two TFTs of a switching transistor and a driving transistor, and a storage capacitor. The emission of the organic light-emitting diode device is controlled by the pixel drive circuit. Pixels are disposed in each portion of intersections in which n number of data lines supplying data signals (or also referred to as "image signals") and m number of scanning lines (also referred to as "gate lines" hereinafter) supplying scanning signals are disposed in a matrix of m number of rows by n number of columns.

A pixel is driven by supplying in turn a turn-on voltage from a first (first line) gate line, and by supplying in turn scanning signals to the m number of rows of gate lines within one frame period. In this driving method, while the turn-on voltage is being supplied to a certain gate line, the switching transistors connected to the data lines are all brought into continuity, and a data voltage is supplied to the n number of columns of data lines in synchronization therewith. This is commonly used in an active matrix drive liquid display.

The data voltage is stored in a storage capacitor while the turn-on voltage is being supplied to the gate lines, and is substantially kept during one frame period. The voltage value of the storage capacitor defines the gate voltage of the driving transistor, thereby controlling a value of the current passing through the driving transistor and the light emission of the organic light-emitting diode device. In other words, the active matrix drive OLED display can execute a predetermined light emission during the one frame period.

Compared with the active matrix drive OLED display, in the passive matrix drive OLED display, a current flows to an organic light-emitting diode device with light being emitted only during the time when a certain scanning line is selected. Therefore, in order to acquire the same brightness as that acquired when light is emitted during the entire one frame period in the active matrix drive OLED display, emission brightness of almost several times the scanning line is needed. For this implementation, a voltage as well as a current for driving the organic light-emitting diode device must be increased. As a result, the energy is lost due to heat generation or the like, and thereby power efficiency is reduced.

In this way, the active matrix drive has an advantage over the passive matrix drive in terms of reduction in power consumption.

In the case of implementing the active matrix drive OLED display, a switching device of TFT or the like is required. The switching device is required to electrically drive the organic light-emitting diode device. Taking account of deterioration in specification due to high mobility and a shift in threshold voltage, a polysilicon TFT should preferably be used.

FIG. 17 is a schematic cross-sectional view showing a conventional OLED display near a pixel having a low temperature polysilicon TFT as a switching device 10. When a low temperature polysilicon TFT is formed on a transparent substrate 6 having a less expensive glass substrate instead of an expensive substrate such like quartz glass substrate, a first foundation layer 11 having SiN for blocking ions and a second foundation layer 102 having SiO are stacked on the transparent substrate 6 so as to be prevented from a problem such as a variation in a threshold voltage due to the mixing in of ions, such as Na, K or the like. Furthermore, a gate insulating layer 16 constituting TFT and additional interlayer insulating layers 18, 20 are stacked on the transparent substrate 6.

As described above, in the active matrix drive OLED display, there exist a plurality of films of different refractive index between the organic light-emitting diode device 70, which includes: organic films 100 having an emissive layer; a transparent electrode 200; and a reflective electrode 300 and the transparent substrate 6. The thickness of these films, which ranges from tens to hundreds of nm, has the influence of interference on the light 2000 which is emitted from the emissive layer and travels to the viewer 1000.

FIG. 18 shows an exemplary measurement result of an emission spectrum of a conventional active matrix drive OLED display. A viewing angle dependency of green emission spectrum is shown in the figure. When the viewing angle changes, a ratio of emission intensity relative to a wavelength changes affected by optical interference. FIG. 19 also illustrates an exemplary measurement of a viewing angle dependency of chromaticity of the conventional active matrix drive OLED display. In the figure, a chromaticity from 0 to 75 degrees of the viewing angle is plotted in every 15 degrees for displaying the three primary colors of red, green and blue, and white. As described above, in the conventional active matrix drive OLED display, there arise unacceptable color variations depending on the viewing angle.

In contrast to this problem, it has conventionally proposed to provide the light-emitting device with a means for scattering light to suppress color variations due to the viewing angle. In this case, when the scattering means, such as a light scattering layers is provided that can sufficiently restrict the affection of interference, light incident on the display from outside scatter-reflects off the scattering means and so can not make a display of black well. The light appears whitish under light circumstances. Thus, it is impossible to get sufficient contrast ratio under light circumstances. This is another problem.

FIG. 20 is a diagram showing a result of a calculation of a viewing angle dependency of interference intensity in a green pixel of the conventional active matrix drive OLED display. As the figure shows, in the conventional active matrix driving OLED display, a number of maximum and minimum values of the interference intensity exist caused by reflection on the interface of the foundation layer and interlayer insulating layer in a visible wavelength range, and a spacing between a wavelength having intensity of interference reaching the maximum value and a wavelength having intensity of interference reaching the minimum value becomes narrower, such as about tens of nm on the side of a short wavelength. Furthermore, the maximum and minimum values move to the side of the short wavelength by about 70 to 140 nm with an increase in the viewing angle.

Therefore, even if a condition is adopted which enhances the intensity of a desired wavelength by controlling the film thickness of the electron transporting layer or an optical thickness from the cathode (reflective electrode) to anode (transparent electrode), on which attention is focused in the conventional technology, the maximum and minimum values, which exist on the long wavelength side rather than the desired wavelength side, move to and appear on an emission wavelength region as the viewing angle increases from 0 to 30, 45, and 60 degrees. Therefore, the emission spectrum observed by the viewer changes, resulting in a change of color.

SUMMARY OF THE INVENTION

It is an object of the present invention to provide a light-emitting display that includes a light-emitting device which is subject to the influence of optical interference, such as an organic light-emitting diode device or the like, and makes a display with less variation in color due to the viewing angle.

It has been found that it is impossible to control the color variations due to the viewing angle in the active matrix drive OLED display just by the thickness of an electron transporting layer, or the optical thickness from the cathode to anode, on which importance has been placed in the conventional technology, and that it is necessary to take account of the interference caused by reflection at the interface between the foundation layer and interlayer insulating layer. Moreover, while the conventional technology has focused attention only on an emission wavelength region when setting a condition of interference, this has turned out to be insufficient. In other words, it has been found that the state of the interference intensity on the side of the wavelength, which is longer than the emission wavelength, is more important for suppressing the color variations due to the viewing angle.

Following [1] to [16] are means for solving the above problems. They correspond to claims 1 to 16.

[1] A display having light-emitting devices constituting a plurality of pixels disposed in a matrix form characterized in that a wavelength, of which intensity of interference (also referred to as "interference intensity" hereinafter) to the light emitted from an emissive layer constituting the light-emitting device reaches the maximum value at 0 degrees of the viewing angle, is shorter than a wavelength of the light, which is emitted from the emissive layer and has intensity of light (also referred to as "emission intensity" hereinafter) reaching the maximum.

[2] Putting the characteristic of [1] into another way, the display having light-emitting devices constituting a plurality of pixels disposed in a matrix form is characterized in that, assuming that a wavelength, of which interference intensity to the light emitted from the emissive layer constituting the light-emitting device reaches the maximum value at 0 degrees of the viewing angle, is $\lambda imax$, and the wavelength, that has emission intensity reaching the maximum, is $\lambda emax$, then a relationship of $\lambda imax < \lambda emax$ is satisfied.

[3] Optionally, the display having the light-emitting devices constituting a plurality of pixels disposed in a matrix form, characterized in that the wavelength, of which intensity of interference to the light emitted from the emissive layer constituting the light-emitting device reaches the minimum value, is longer than the wavelength of the light, which is emitted from the emissive layer and has the intensity of light reaching the maximum, and does not exist in a visible wavelength range.

According to the characteristics described in the above [1] to [3], while the wavelength, which has interference intensity reaching the maximum or minimum value, moves to the side of a shorter wavelength as the viewing angle increases, the maximum or minimum value of interference intensity dose not move to an emission wavelength region even if the viewing angle increases. Therefore, the influence that a viewing angle dependency of the interference intensity has on the ratio of emission intensity (also referred to as a shape of an emission spectrum hereinafter) relative to the emission wavelength becomes smaller, thus making it possible to suppress variations in color due to the viewing angle.

[4] Furthermore, desirably, the display having light-emitting devices constituting a plurality of pixels disposed in a matrix form, characterized in that assuming that the wavelength, of which intensity of interference to the light emitted from the emissive layer constituting the light-emitting device reaches the maximum at 0 degrees of the viewing angle, is $\lambda imax$, and the wavelength which is emitted from the emissive layer and has intensity of light reaching the maximum is $\lambda emax$, then a relationship of $\lambda emax-50\ nm \leqq \lambda imax \leqq \lambda emax$ is satisfied.

In this case, since the emission intensity is enhanced by interference, the color variations due to the viewing angle are suppressed, and a brighter display is implemented at the same time.

[5] Furthermore, desirably, the display having light-emitting devices constituting a plurality of pixels disposed in a matrix form, characterized in that assuming that the wavelength, of which intensity of interference to the light emitted from the emissive layer constituting the light-emitting device reaches the minimum value at 0 degrees of the viewing angle, is $\lambda imin$, and the wavelength which is emitted from the emissive layer and has light intensity reaching the maximum is $\lambda emax$, then a relationship of $\lambda emax+70\ nm \leqq \lambda imin$ is satisfied.

This prevents the wavelength, which has the interference intensity reaching the minimum value, from moving to the wavelength that has emission intensity reaching the maximum and from changing substantially the shape of an emission spectrum, even if the viewing angle increases, thus making it possible to suppress the color variations due to the viewing angle.

[6] The display having light-emitting devices constituting a plurality of pixels disposed in a matrix form, characterized in that the light emitted from the emissive layer constituting the light-emitting devices is white, or a plurality of maximum values exist in the emission intensity; the wavelength, of which intensity of interference to the light emitted from the emissive layer reaches the maximum value at 0 degrees of the viewing angle, is shorter than the wavelength of the light, which is emitted from the emissive layer in the visible wavelength range and has intensity of light reaching the maximum value; and the wavelength, which has interference intensity reaching the minimum, is longer than the wavelength of the light, which is emitted from the emissive layer and has intensity of light reaching the maximum value, and dose not exist in the visible wavelength range.

In this situation, while the maximum or minimum value of the interference intensity moves to the side of shorter wavelength as the viewing angle increases similarly to the above [1] to [3], the maximum or minimum value of the interference intensity does not move to the emission wavelength region even if the viewing angle increases. Therefore, the shape of the emission spectrum is hardly changed, thus making it possible to reduce the change in color even if the viewing angle changes.

[7] A color display having light-emitting devices constituting a plurality of pixels disposed in a matrix form, characterized in that assuming that the wavelength, of which intensity of interference to the light emitted from the emissive layer reaches the maximum value at 0 degrees of the viewing angle, is $\lambda imax$, the wavelength of which intensity of interference reaching the minimum value is $\lambda imin$, and the wavelength which is emitted from the emissive layer and has intensity of light reaching the maximum is $\lambda emax$, then a relationship of $\lambda emax-50\ nm \leqq \lambda max < \lambda emax$, or $\lambda emax+70\ nm \leqq \lambda imni$ is satisfied.

[8] Furthermore, the color display described in the above [7], characterized in that the light-emitting device is an organic light-emitting diode device, and assuming that the thickness of the organic film constituting the organic light-emitting diode device is RT in a red pixel, GT in a green pixel, and BT in a blue pixel, then $RT \geqq GT \geqq BT$.

In this situation, the wavelength having interference intensity reaching the maximum value typically moves to the side of longer wavelength, as the organic film of a hole transporting layer or an electron transporting layer becomes thicker. If the above condition of film thickness is satisfied, the interference intensity for each color is increased, with luminous efficacy being enhanced while the color variations due to the viewing angle are being suppressed.

[9] Moreover, the display is characterized in the active matrix drive display in which light is taken out from the side of a transparent substrate which is formed with a switching device for controlling the blinking of the light-emitting device so as to satisfy the condition of the above interference intensity, and at least one layer of a plurality of insulation films constituting the switching device is selectively removed in at least an emitting region of the pixel.

[10] In particular, the selectively removed film is characterized by a refractive index difference of 0.4 or over against the transparent substrate or transparent electrode constituting the light-emitting device.

In this case, since the number of the reflection interface and the thickness of the entire film are reduced, the spacing between the wavelengths having interference intensity reaching the extreme value (the maximum or minimum value) becomes longer. Therefore, the condition of above interference intensity is implemented, thus making it possible to reduce the color variations due to the viewing angle.

[11] The display, characterized in that the switching device includes a low temperature polysilicon TFT, wherein the foundation layer formed between the switching device and the transparent substrate, and the plurality of insulation layers constituting the switching device are all removed in the emission region of the pixel in order to satisfy the above interference intensity conditions.

[12] Additionally, the switching device is characterized by being surrounded in every direction by films of ion blocking properties.

In the cases of the above [11] and [12], when the foundation film is removed in order to satisfy the above condition of interference intensity, a path is formed through which ion such as Na or K mixes in. However, it is possible to be prevented from a variation in threshold voltage of the low temperature polysilicon TFT caused by the mixing in ion by surrounding the switching device in its every direction with the films of ion blocking properties.

[13] The display having light-emitting devices which constitute a plurality of pixels disposed in a matrix form, characterized in that the intensity of the light to be taken out to the viewer side from the display reaches the maximum at 0 degrees of the viewing angle.

[14] Additionally, the display is characterized in that the variation amount of the wavelength, of which intensity of the light that is taken out from the display to the viewer side reaches the maximum, is 10 nm or below, even if the viewing angle changes from 0 to 60 degrees. These represent the characteristics of the light-emitting spectrum which are acquired in the display satisfying the above interference intensity condition. Therefore, a display in which color variations due to the viewing angle are small can be implemented by satisfying the characteristics of [13] and [14].

[15] The display having light-emitting devices constituting a plurality of pixels disposed in a matrix form, characterized in that light is taken out from a side opposite to the substrate where the light-emitting device is formed, and assuming that a wavelength, of which intensity of interference to the light emitted from the emissive layer constituting the light-emitting device reaches the maximum value at 0 degrees of the viewing angle, is λimax, a wavelength of which intensity of interference reaching the minimum value is λimin, and a wavelength of the light, which is emitted from the emissive layer and has intensity of light reaching the maximum, is λemax, then relationships of λimax<λemax, and λimin≧λemax+70 nm are satisfied.

[16] The display according to [15], characterized in that the light-emitting device has an optically transparent electrode on a side from which light is taken out, and a transparent element with a refractive index of 1.4 to 2.0 is provided on the surface of the electrode from which light is taken out.

The above [15] relates a so-called top-emission type display in which light is taken out from a side opposite to the substrate on which the light-emitting device is formed. In this case, while as the viewing angle increases, the wavelength having interference intensity reaching the maximum or minimum value moves to the side of a shorter wavelength, they do not move to the wavelength of the light, which is emitted from the emissive layer and has intensity of light reaching the maximum. Therefore, the affection that the viewing angle dependency of interference intensity exerts on the emission spectrum is reduced, thus making it possible to suppress the color variations due the viewing angle.

[16] Furthermore, in the top emission type light-emitting display, a transparent element with a refractive index higher than gas is provided on a light taking out side of the optically transparent electrode which is formed on a light taking out side of the light-emitting device, or on the light taking out side of the transparent electrode, thereby reducing reflections on an interface of the light taking out side of the transparent electrode. In this situation, since the interference intensity is wakened and thereby the difference between the maximum and minimum values of interference intensity is reduced, the variation in the magnitude of the interference intensity caused by the viewing angle and the color variations due to the viewing angle are reduced.

Other objects, features and advantages of the invention will become apparent from the following description of the embodiments of the invention taken in conjunction with the accompanying drawings.

DETAILED DESCRIPTION OF THE EMBODIMENTS

An organic film that includes an emissive layer which constitutes each pixel includes a film for making a mono color display or a full color display by emitting light with color (including white) which depends on the material, and a film for making a color display by combining an organic film that emits white light with a color filter, such as a red, a green or a blue filter, or the like.

Figure 1:
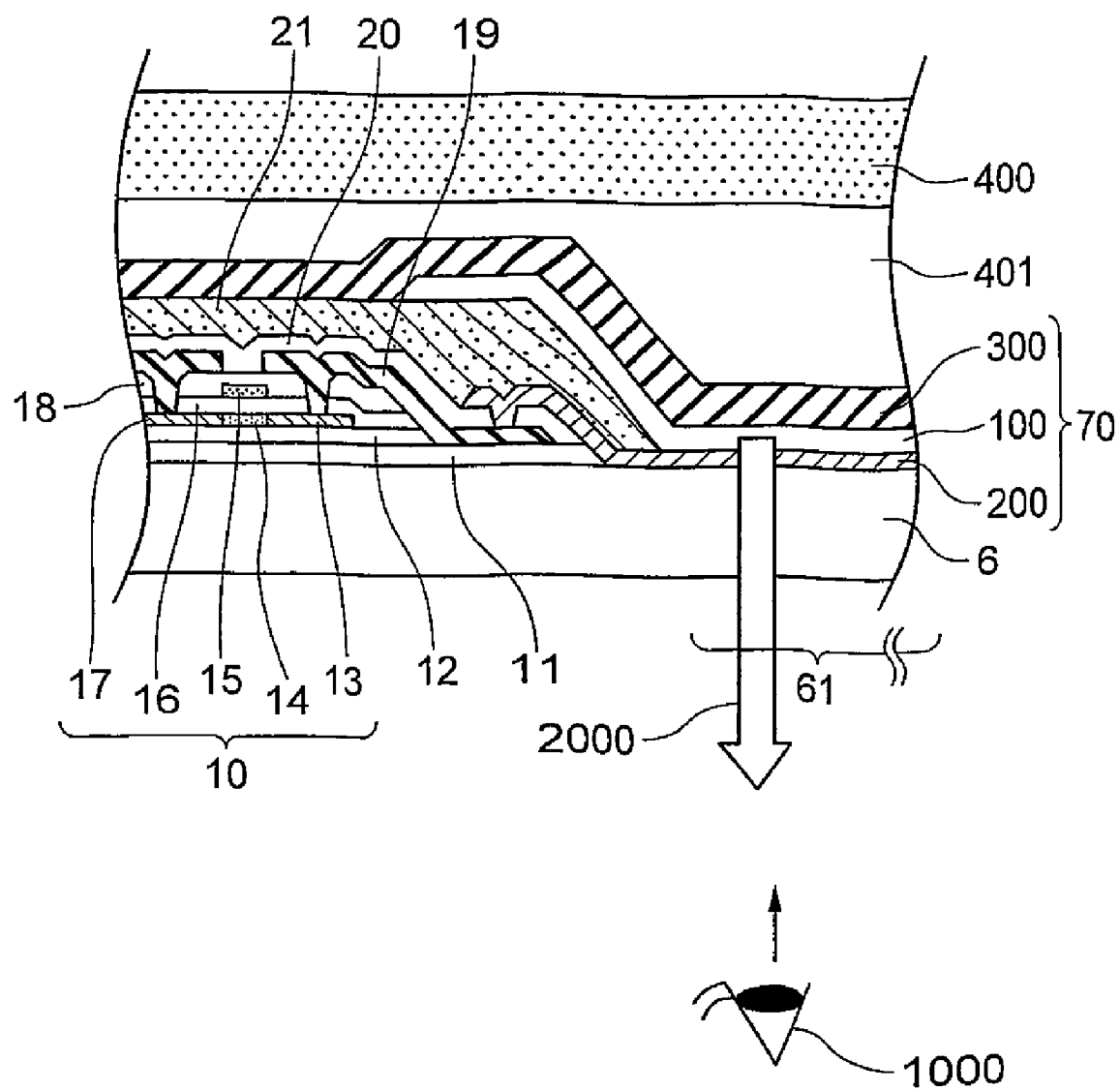
FIG. 1 is a schematic cross-sectional view in the vicinity of one pixel illustrating a configuration of an exemplary embodiment of a display according to the present invention.
Figure 2:
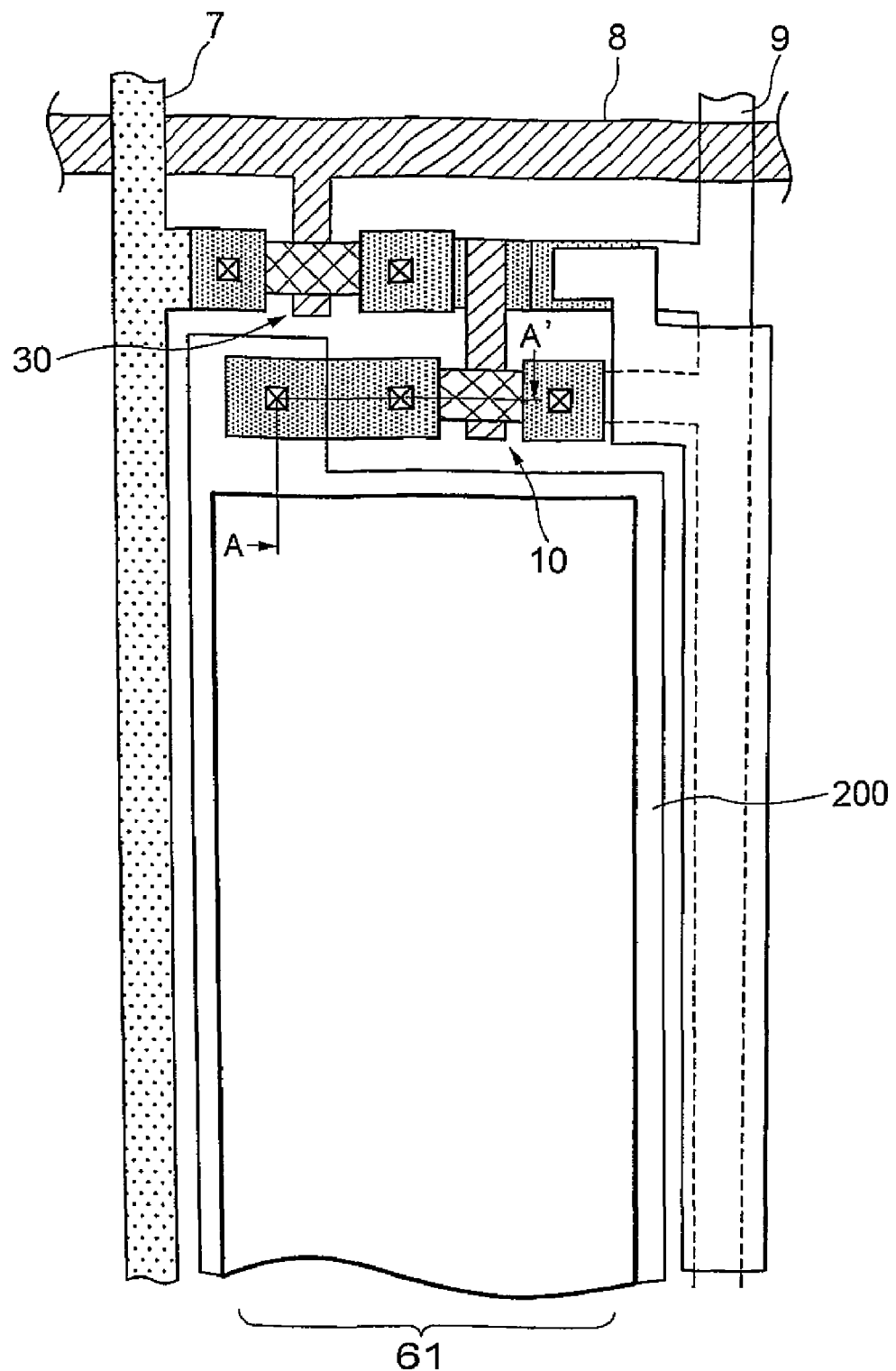
FIG. 2 is a partial plane view illustrating an exemplary embodiment of a structure of a pixel unit of the display according to the present invention.
Figure 3A:
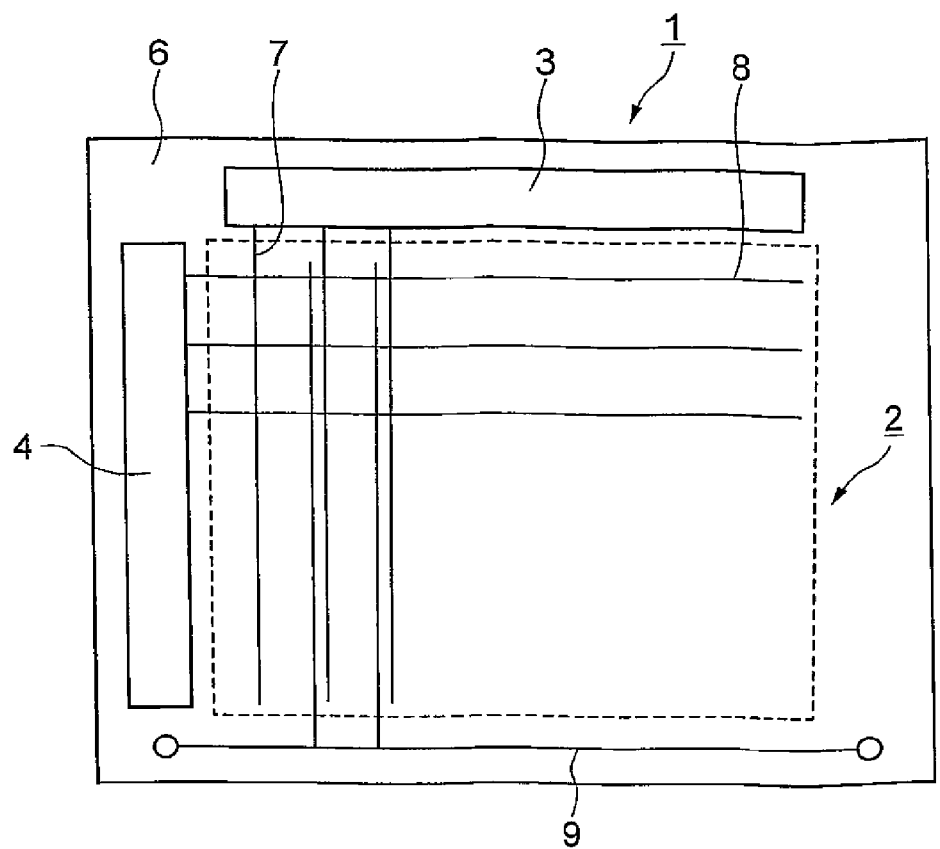
FIGS. 3A and 3B are block diagrams schematically illustrating the entire layout of the display according to the present invention.
Figure 3B:
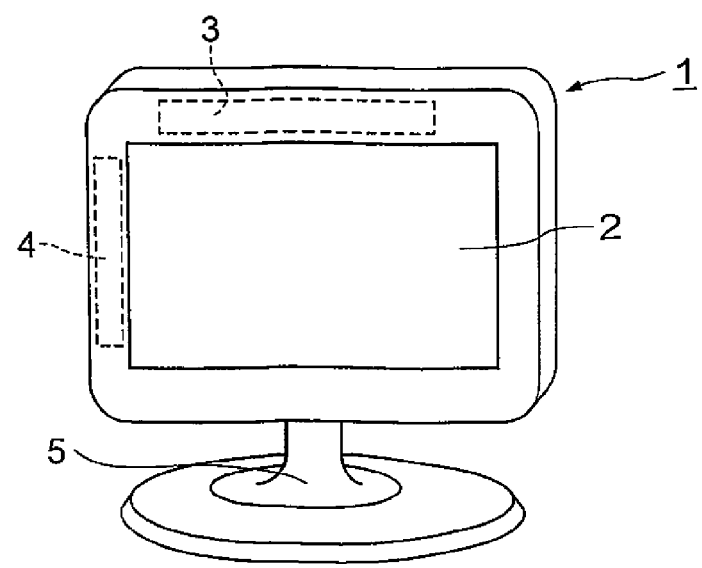
Figure 4:
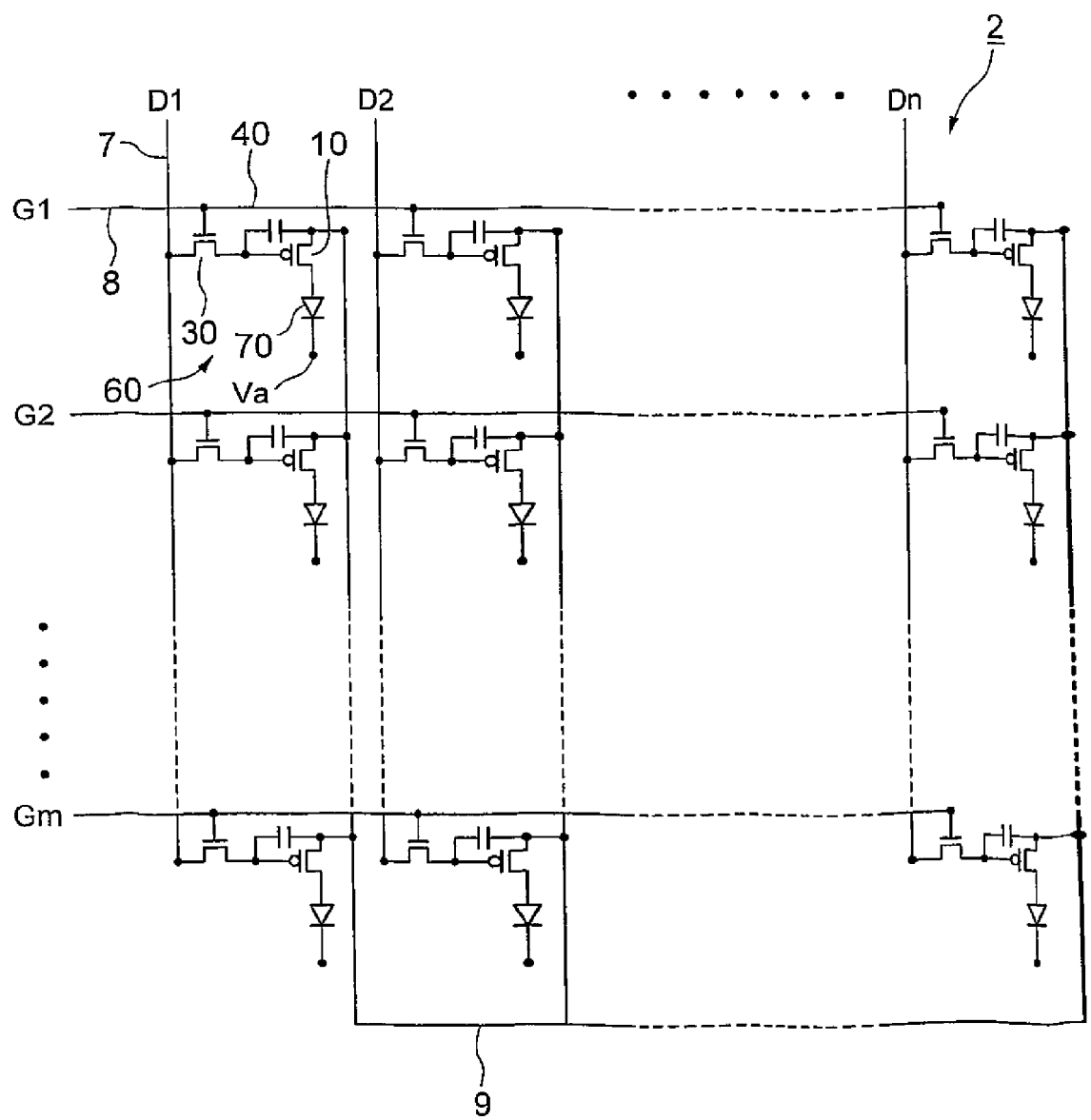
FIG. 4 is a diagram of equivalent circuit of an active matrix which is formed on the display unit of a display according to the present invention.

FIG. 1 is a schematic cross-sectional view in the vicinity of one pixel illustrating a configuration of an exemplary embodiment of a display according to the present invention. FIG. 2 is a partial plane view illustrating a structure of a pixel unit of the display according to the present invention. The display is an active matrix drive OLED display having a switching device that comprises thin film transistors and organic light-emitting diode devices. FIGS. 3A and 3B are block diagrams schematically showing the entire layout of a display 1. FIG. 4 is an equivalent circuit diagram of an active matrix constituting a display area 2.

As shown in FIG. 3A, in a display 1, the display area 2 is provided nearly in the center of a transparent substrate 6 that comprises a transparent and insulation substrate such as glass or the like. A data driving circuit 3 for outputting image signals to a data line 7 is placed on the upper side of the display area 2, while a scan driving circuit 4 for outputting scan signals to a gate line 8 is placed to the left side. These driving circuits 3, 4 include a shift register circuit, a level shifter circuit, an analog switching circuit, or the like, which is composed of a complementary circuit of N-channel and P-channel TFT (Thin Film Transistor). Furthermore, a common potential line 9 is placed to extend in the same direction as the data line 7. It should be noted that the display 1 is supported by a leg 5, as shown by FIG. 3B, and can be used as a monitoring equipment for a television image, a computer image, and the like. It can also be used by itself as a television receiver by incorporating a television tuner therein.

In the display 1, as is the case with the active matrix drive liquid crystal display, a plurality of gate lines and a plurality of data lines extending in a direction that intersects the direction in which the gate lines extend are provided on a transparent substrate 6, and as FIG. 4 shows, pixels 60 are disposed in a matrix form at the places where m gate lines G1, G2, . . . , Gm and n data lines D1, D2, . . . Gn, intersect. Each pixel includes: a light-emitting device 70; a storage capacitor 40; a switching transistor 30 composed of an N-channel TFT in which a gate electrode is connected to the gate line, one source/drain electrode is connected to the data line, and the other source/drain electrode is connected to a storage capacitor 40; and a driving transistor 10 comprised of P-channel TFT in which the gate electrode is connected to the storage capacitor 40, the source electrode is connected to a common potential line 9 which extends in the same direction as the data line, and the drain electrode is connected to one electrode (anode) of an organic light-emitting diode device which constitutes the light-emitting device 70. Furthermore, the other electrode (cathode) of the organic light-emitting diode device constituting the light-emitting device 70 is connected to a current supplying line common to all pixels and held at a predetermined potential Va.

The pixel 60 is driven by supplying in turn a turn-on voltage from a gate line G1 of a first row, and then supplying in turn a voltage (scan signals) to m number of rows of the gate lines within one frame period. When the switching transistor 30 is turned on by the scan signals, image signals are written into the storage capacitor 40 from the data line via the switching transistor 30. In other words, while the turn on voltage is being supplied to a certain gate line, the switching transistors connected to the gate line are all brought in continuity, with data voltage being supplied to n number of columns of the data lines in synchronization therewith.

The data voltage is stored in the storage capacitor while the turn-on voltage is being supplied to the gate line. The gate electrode of the driving transistor 10 is held at a potential corresponding to an image signal for one frame period by the storage capacitor 40, even if the switching transistor 30 is turned off. The voltage value of the storage capacitor defines the gate voltage of the driving transistor 10, thus the value of current flowing through the driving transistor 10 as well as the emission of the organic light-emitting diode device 70 being controlled. Emission is stopped by turning off the driving transistor 10.

More specifically, it is possible to control the amount of light emission of the pixel 60 by applying voltage corresponding to image information via the data line 7 in synchronization with the turn-on voltage which is applied to the gate line 8 corresponding to the pixel 60, of which emission amount is to be controlled. Therefore, it is possible to display a desired image by controlling the amount of light emission of a plurality of pixels which constitute the display unit 2 depending on the image information. Moreover, it is possible to display fast-moving images, since a response time from the time when voltage is applied to both ends of the cathode and anode of the light-emitting device 70 to the time when emission starts is typically 1 µs or below.

Here, when implementing, for example, a display that makes a full color display, a light-emitting device 70 which emits any color of red, green or blue is disposed in a predetermined order and in a matrix form. In other words, the emission wavelength of an organic light-emitting diode is made to correspond to the three primary colors of red, green and blue.

Next, the structure of the display 1 in the vicinity of a pixel will be described with reference to FIGS. 1 and 2. FIG. 2 is a partially schematic plane view for explaining a planar structure of a pixel portion of the display 1. FIG. 1 is a schematic cross-sectional view in the vicinity of a pixel showing a cross-sectional structure taken along the line of A-A' in FIG. 2.

The display includes switching devices 10, 30 which are composed of thin film transistors and are formed on an insulative transparent substrate 6. The switching device such as the driving transistor 10 and switching transistor 30 which constitute a pixel circuit, includes a polysilicon thin film transistor.

The polysilicon thin film transistor has a gate insulation layer 16, a gate line layer 15, a first interlayer insulating layer 18, a source/drain electrode layer 19 and a second interlayer insulating layer 20 which are formed on a polysilicon layer that includes source/drain regions 13, 17, and a channel polysilicon layer 14.

Furthermore, the display has a first foundation layer 11 including SiNx film, or the like, between the polysilicon thin film transistor and transparent substrate 6. The first foundation layer 11 is intended for preventing ion such as Na, K or the like from mixing in the polysilicon layer 14 and gate insulation layer 16 from the transparent substrate 6. It also has a second foundation layer 12 including Siox film or the like between the first foundation layer 11 and polysilicon layer.

The display of the present embodiment is formed with an opening such that the first and second foundation layers 11, 12, the gate insulation layer 16 and the first and second interlayer insulating layers 18, 20 are selectively removed or not formed on a region corresponding to the emission region of the pixel 61 because of a reason described below.

A transparent electrode 200, which functions as an anode in the organic light-emitting diode device 70, is formed in an insular shape to cover a portion of a pixel which constitutes an emission region 61. In this situation, the transparent electrode 200 is connected to the drain electrode 19 via the opening that passes through the second interlayer insulating layer 20. In the emission region 61, the transparent electrode 200 is formed on the transparent substrate 6 without the insulation layer therebetween.

A third interlayer insulating layer 21, as shown in FIG. 1, having an aperture corresponding to the emission region 61 of the pixel is formed on a non-emission region, such as the switching transistor 30, driving transistor 10, data line 7, gate line 8 and a common potential line 9, as shown in FIG. 2, and on a non-emission region of the transparent electrode 200. While an organic film 100 including an emissive layer is formed to cover the pixel on the transparent electrode 200, it is separated from the transparent electrode 200 by the third interlayer insulating layer 21 on a region other than the emission region 61. A reflective electrode 300, which functions as a cathode in the organic light-emitting diode device 70, is formed on the organic film 100 such that it extends across the entire display area 2.

It should be noted that the display according to the present embodiment is a so-called bottom-emission type OLED display in which a light 2000, that is emitted from the emissive layer of the organic light-emitting diode device 70 and travels toward a viewer 1000, is taken out from the side of the transparent substrate 6 which is formed with the organic light-emitting diode device 70. The organic film 100 of the organic light-emitting diode device 70 may include a layer in which an electron transporting layer, an emissive layer and a hole transporting layer are stacked between the anode (transparent electrode 200) and cathode (reflective electrode 300) in this order from the cathode side.

In such an organic light-emitting diode device, when direct-current voltage is applied to the transparent electrode 200 serving as an anode and the reflective electrode 300 serving as a cathode, holes that are injected from the transparent electrode 200 arrive at the emissive layer via the hole transporting layer, electrons injected from the reflective electrode 300 arrive at the emissive layer via the electron transporting layer, and the electrons and holes are recombined, thereby predetermined wavelengths being emitted therefrom.

For the organic film 100 of the organic light-emitting diode device 70, a material, which can double as the emissive layer and electron transporting layer, may be used. A material in which an anode buffer layer or a hole injection layer is deposited between the anode (transparent electrode 200) and hole transporting layer may also be used.

A transparent electrode material with high work function may be used for the anode (transparent electrode 200) and, for example, ITO (Indium tin oxide) is suitable. InZnO may also be used.

For the reflective electrode 300 serving as a cathode, Al, Mg, an Mg—Ag alloy, an A—Li alloy or the like with low work function, may be used. Al as a single substance requires a high driving voltage and has a short lifetime. Therefore, a very thin Li compound (lithium oxide $Li_2O$, lithium fluoride LiF, etc) may be inserted between the reflective electrode 300 and the organic film 100 to acquire a characteristic comparable to the A—Li alloy. Furthermore, a portion of the organic film contacting the cathode may be doped with a highly reactive metal, such as lithium, strontium, or the like, to reduce the driving voltage.

Moreover, the reflective electrode 300 desirably includes a material of high reflectance with a view to enhancing the utility of the light emitted from the emissive layer. For the organic film 100, a material is used that may emit light in a desired color by applying predetermined voltage and passing current between the anode (transparent electrode 200) and cathode (reflective electrode 300).

As for a material for emitting red, for example, α-NPD (4.4'-bis[N-(1-naphthyl)-N-phenylamino]biphenyl), triphenyldiamine derivatives TPD (N,N'-bis(3-methylphenyl)-N, N'-diphenyl-[1,1'-biphenyl]-4,4'-diamine), or the like may be used for the hole transporting layer. For example, a material composed of Alq3 (tris(8-quinolinolate)aluminum), and DCM-1 (4-(dicyanomethylene)-6-(p-dimethylaminostyryl)-2-methyl-4-H-pyran) which is dispersed therein, may be used for an electron transporting emissive layer (which doubles as the electron transporting layer and emissive layer).

As for a material for emitting green, for example, α-NPD, triphenyldiamine derivatives TPD or the like may be used for the hole transporting layer and, for example, Alq3, Bebq (bis(8-hydroxy quinolinate)beryllium), Alq3 doped with quinacridone, or the like may be used for the electron transporting emissive layer (which doubles as the electron transporting layer and emissive layer).

As for a material for emitting blue, for example, α-NPD, triphenyldiamine derivatives TPD, or the like may be used for the hole transporting layer. For example, DPVBi (4,4'-bis(2, 2-diphenylvinyl)biphenyl), a material containing DPVBi (4,4'-bis(2-diphenylvinyl)biphenyl) and BczVBi (4,4'-bis(2-carbazolevinylene)biphenyl), a material doped with distyrylallylene derivatives as the host and distyrylamine derivatives as a guest, or the like may be used for the emissive layer. For example, Alq3 or the like may be used for the electron transporting layer. Furthermore, for the electron transporting emissive layer (which doubles as the electron transporting layer and emissive layer), for example, a zinc complex, Zn(oxz)2(2-(o-hydroxyphenyl)benzoxazole) may be used.

Moreover, in addition to the above small molecular material, a polymer material may be used. The polymer material that may be used includes a lamination film of PEDT/PSS (mixed layer of Polyethylene dioxythiophene and Polystyrene sulphonate), and PPV (poly(p-phenylene vinylen) for the hole transporting layer and emissive layer. Green emission is achieved by PPV filled with green ink. Red emission is achieved by green ink to which Rhodamine 101 is added as a red emitting dopant. For the blue-emitting layer, FS (Poly (dioctylfluorene)) may be used. The FS also functions as the electron transporting layer. Polymer containing a coloring agent, such as PVK (poly(N-vinylcarbazole), is also included in the polymer materials that may be used.

Whichever material may be used, each layer that constitutes the organic film 100 typically measures tens of nm in thickness, and is smaller than the wavelength of light. It should be noted that the present invention is not limited to the above material. In other words, any material may be used that emits desired colors having a longer life time with a higher efficiency.

FIGS. 5A-5C, 6A-6C, and 7A-7C explain an exemplary manufacturing process of the display according to the present invention, and they are schematic views explaining each cross section in the vicinity of a pixel in the order of processing steps. It should be noted that while a thin film transistor of a so-called top gate structure is used in the present embodiment, a thin film transistor of a so-called bottom gate structure is not omitted in the present invention. A brief explanation of the process will be given below step by step.

Figure 5A:
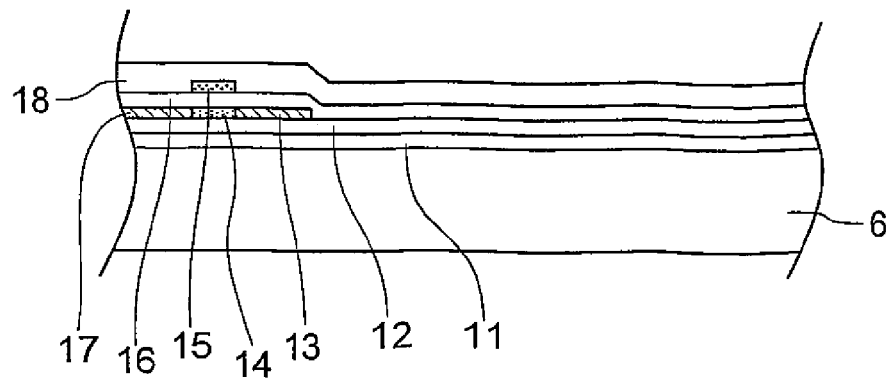
FIGS. 5A to 5C are schematic cross-sectional views in the vicinity of a pixel explaining in the order of processing steps an exemplary manufacturing process of the display according to the present invention.

FIG. 5A is a schematic cross-sectional view in which a first interlayer insulating layer 18 is stacked, after a first and a second foundation films 11, 12, an insular polysilicon layer including: a source/drain region 13, 17; and a channel polysilicon layer 14, a gate insulation layer 16, and a gate electrode 15 are formed on a transparent substrate 6.

The first foundation film 11 includes SiNx. The film is said to block ion, such as Na, or K, from the transparent substrate 6. SiOx is stacked on the first foundation film 11 as the second foundation film 12. On the SiOx layer, the insular polysilicon layer, which constitutes the basis for forming the channel polysilicon layer 14 and source/drain region 13, 17, is formed. The polysilicon layer is provided by processing an amorphous silicon layer which is formed on the second foundation layer 12 into an insular form and then crystallizing it by laser annealing. On the polysilicon layer, the gate insulation layer 16 containing SiOx is stacked. On the gate insulation layer 16, the gate electrode 15 including a conductive thins film, such as titan (Ti), tungsten (W), or the like, is formed. After that, the source/drain region 13, 17 is formed on the polysilicon layer by applying suitable phosphorus ion doping with the gate electrode 15 as a mask, and then the first interlayer insulating layer 18 is formed.

Figure 5B:
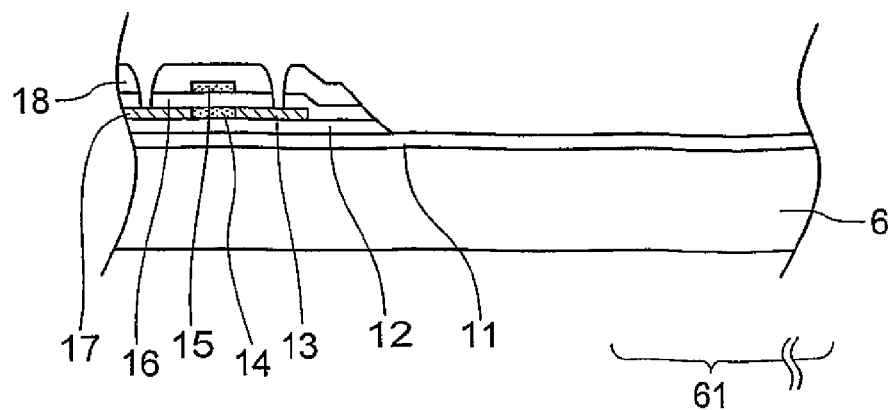

Next, as FIG. 5B shows, contact holes passing through the first interlayer insulating layer 18 and gate insulation layer 16 are formed on portions corresponding to the source/drain region 13, 17. At this time, a region that later becomes an emission region of the pixels 61, and a region where a drain electrode is connected to the transparent electrode are eliminated together with the first interlayer insulating layer 18 and gate insulation layer 16 as well as the second foundation film 12 to form an opening. The first interlayer insulating layer 18, gate insulation layer 16, and second foundation film 12 are all composed of SiOx. Therefore, without increasing the number of masks and the number of steps due to using the photo-lithography technique, the contact holes penetrated into the first interlayer insulating layer 18 and gate insulation layer 16 and the aperture of the region corresponding to the emission region of the first interlayer insulating layer 18, gate insulation layer 16 and the second foundation film 12 are formed simultaneously.

Figure 5C:
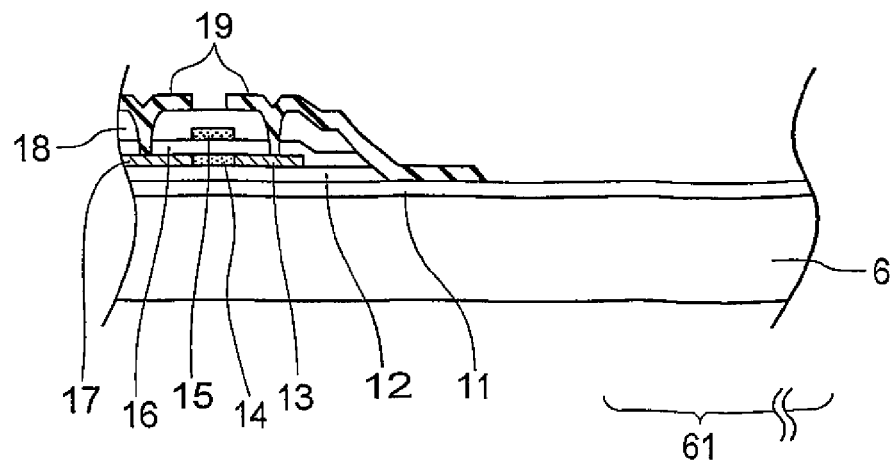

Then, as FIG. 5C shows, a source/drain electrode layer 19 is formed. The source or drain electrode layer 19 is connected to the source/drain region 13, 17 via the contact holes passing through the first interlayer insulating layer 18 and gate insulation layer 16. The connection between the transparent electrode, which later forms a light-emitting device, and the drain electrode 13 is performed as follows. The source/drain electrode layer 19 climbs over a step including the first interlayer insulating layer 18, gate insulation layer 16 and second foundation film 12 and then a portion of the source/drain electrode 19 is also formed on the first foundation film 11. The reason why the above way is taken is as follows. When the transparent electrode must be thinned because of optical reason, a failure, such as a broken wire, tends to occur when the thin transparent climbs over a big step including the first interlayer insulating layer 18, gate insulation layer 16 and second foundation film 12. Such a failure is prevented by having the source/drain electrode layer 19 climb over the step. The source/drain electrode layer 19 may preferably include a film of a three layer stacking structure in which an aluminum film is sandwiched by titan (Ti), tungsten (W) or the like.

Figure 6A:
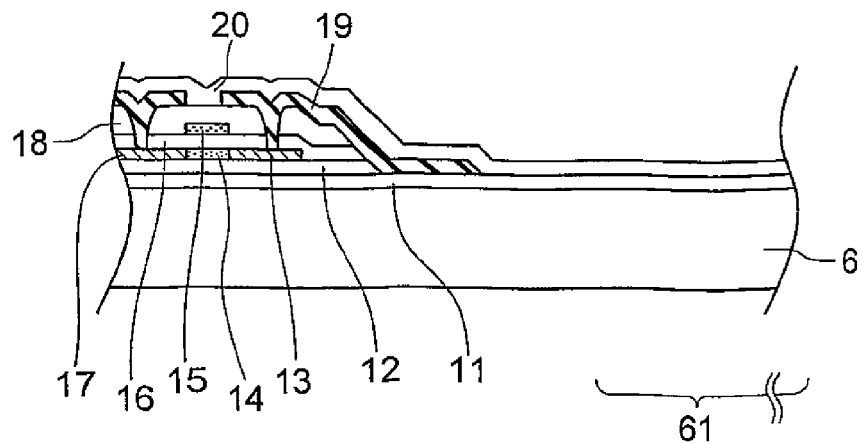
FIGS. 6A to 6C are schematic cross-sectional views in the vicinity of a pixel explaining in the order of processing steps an exemplary manufacturing process of the display according to the present invention.

Next, as shown in FIG. 6A, a second interlayer insulating layer 20 containing SiNx is formed to cover the source/drain electrode layer 19.

Figure 6B:
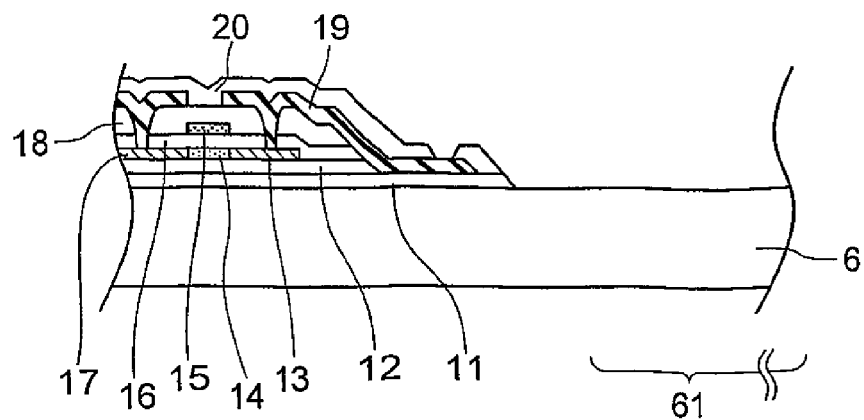

Then, as shown in FIG. 6B, a contact hole that passes through the second interlayer insulating layer 20 is formed on a position corresponding to a portion formed on the first foundation film 11 of the source/drain electrode layer 19. At this time, an aperture is formed by eliminating a portion, which later becomes an emission region 61 of the pixel, together with the second interlayer insulating layer 20 and first foundation film 11. The second interlayer insulating layer 20 and first foundation film 11 are both composed of SiNx. Therefore, the contact holes passing through the second interlayer insulating layer 20 and the opening of the region corresponding to the second interlayer insulating layer 20 and emission region of the first foundation film 11 can be formed simultaneously without increasing the number masks and processes by using the so-called photo-lithography technology.

Figure 6C:
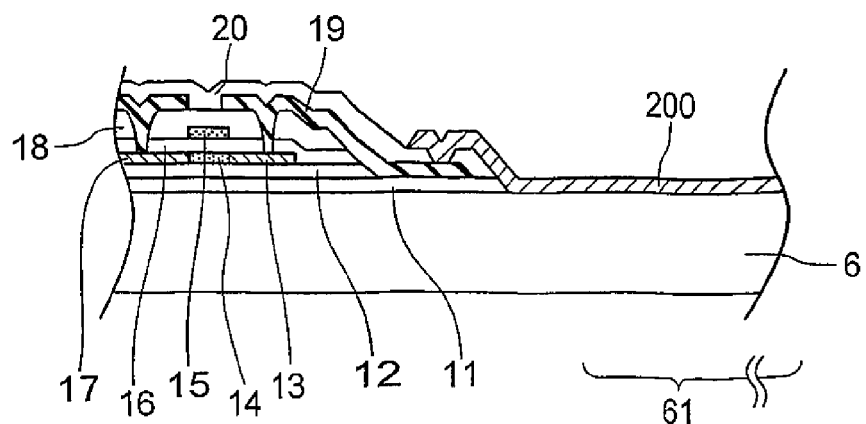

Next, as FIG. 6C shows, a transparent electrode 200 including ITO is deposited by sputtering or the like, and processed into an insular form by the photo-lithography technology. In this situation, the transparent electrode 200 is connected to the drain electrode layer 19 via the contact holes formed on the second interlayer insulating layer 20.

Figure 7A:
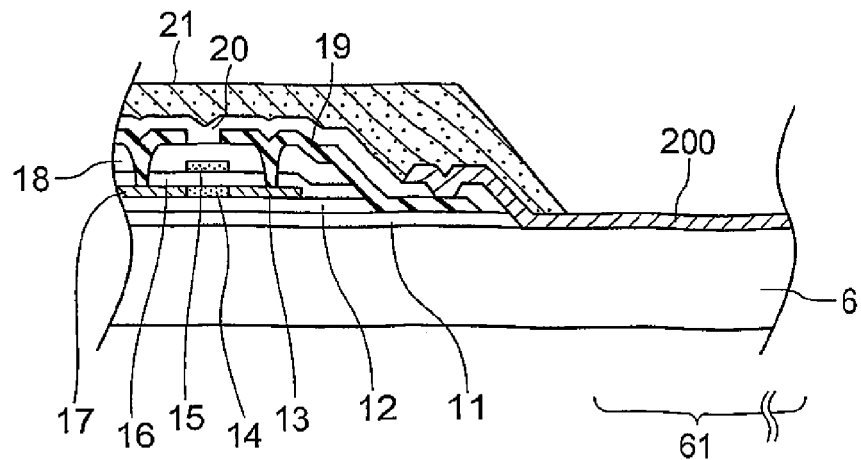
FIGS. 7A to 7C are schematic cross-sectional views in the vicinity of a pixel explaining in the order of processing steps an exemplary manufacturing process of the display according to the present invention.

Then, as FIG. 7A shows, a third interlayer insulating layer 21 having an aperture on a region corresponding to the emission region 61 is formed. The third interlayer insulating layer 21 may include an inorganic material, such as SiNx or the like, an organic material, such as photosensitive polyimide, acrylic resin or the like, or stacked films of these materials.

Figure 7B:
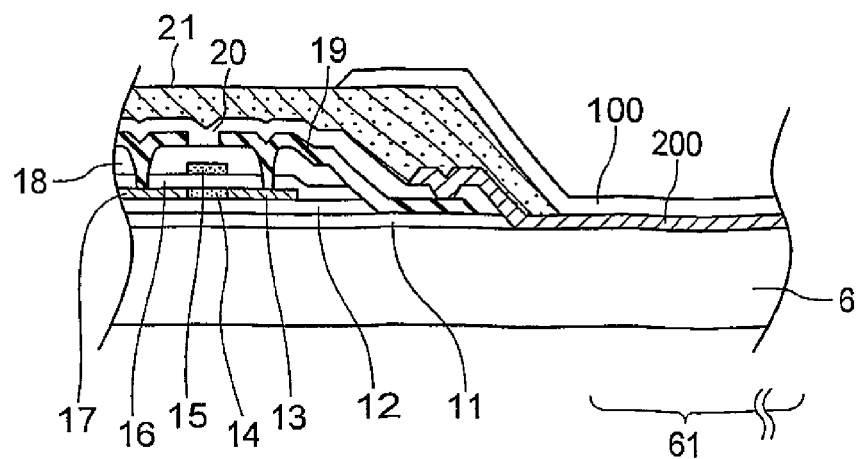

Next, as shown in FIG. 7B, an organic film 100 that includes an emissive layer and the like is formed to cover the emission region 61 of a pixel. The organic film may include the above organic material. For depositing the organic film 100, when the organic film 100 includes a small molecular material, a known selective deposition method of evaporating an organic film under vacuum by a shadow mask may be used. The method, for example, is published in the following publication: S. Miyaguchi, et al. "Organic LED Fullcolor Passive-matrix Display", Journal of the SID, 7, 3, pp 221-226 (1999).

Furthermore, when forming the organic film 100 with a polymer material, a known ink jet patterning technique may be used as published, for example, in the following publication: T. Shimoda, et al. "Multicolor Pixel Patterning of Light-emitting Polymers by Ink-Jet Printing", SID 99 DEGEST, 376 (1999). In this process, the third interlayer insulating layer 21 serves as a bank for separating the emission region of the pixel.

Figure 7C:
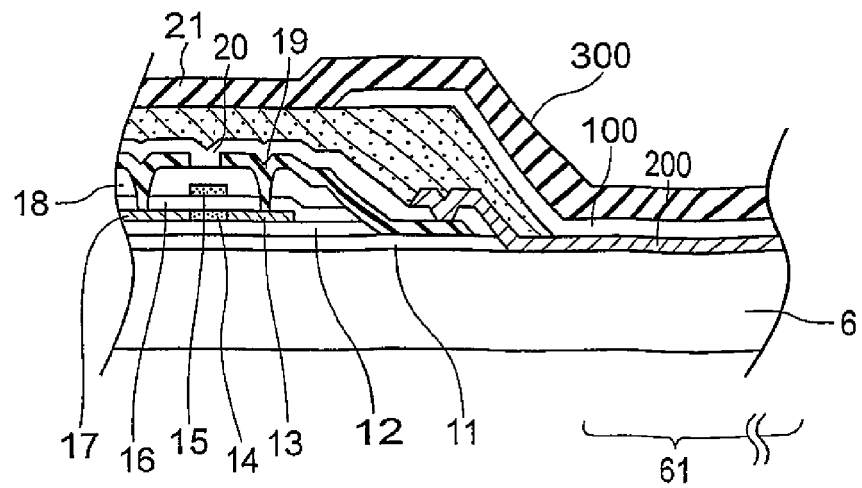

Next, as FIG. 7C shows, a reflective electrode 300 serving as a counter electrode and cathode is formed on the entire organic film 100. The reflective electrode 300 is connected to a power supplying line which is not shown in the figure.

It should be noted that since the organic film 100 is typically susceptible to deterioration from atmospheric moisture or the like, the organic film 100 is desirably hermetically sealed using a sealing material 400 as shown in FIG. 1, to prevent exposure to atmosphere subsequent to the above processes. The sealing material 400 may include a can made of metal, such as stainless steel or the like, a ceramic board, a glass board, a resin film subjected to gas barrier processing or a stacking thin glass board and resin film, or the like. In this situation, the sealing material 400 and substrate 6 may be hermetically bonded by applying an adhesive sealing agent along the periphery of a display area of the display. Inert gas, such as nitrogen gas may be implanted into a gap 401 between the both. Moreover, desiccant may also be provided between the sealing material and substrate 6 as necessary. Alternatively, a film having high gas barrier properties may be stacked directly on the reflective electrode 300 to form the sealing material.

Next, a condition of intensity of interference (also referred to as just "interference intensity" hereinafter) to the light emitted from the emissive layer, which is the essence of the present invention, will be described. In the display having light-emitting devices constituting a plurality of pixels positioned in a matrix form according to the present invention, at least a film in the emission region is configured such that a wavelength, of which intensity of interference (also referred to as just "interference intensity" hereinafter) to the light emitted from the emissive layer reaches the maximum value at 0 degrees of the viewing angle, is shorter than the wavelength of the light, which is emitted from the emissive layer and has intensity of light (also referred to as "emission intensity" hereinafter) reaching the maximum. In other words, the film should be configured to satisfy a relationship of $\lambda\text{imax}<\lambda\text{emax}$, assuming that the wavelength which has interference intensity reaching the maximum value at 0 degrees of the viewing angle is $\lambda\text{imax}$, while the wavelength which has emission intensity reaching the maximum is $\lambda\text{emax}$. In this situation, it is desirable that the wavelength which has interference intensity reaching the minimum value at 0 degrees of the viewing angle does not exist in a visible wavelength range in which the wavelength is longer than that having emission intensity reaching the maximum.

With the above condition, even if the wavelength that has interference intensity reaching the extreme value (maximum value or minimum value) moves to the shorter wavelength side with an increase in the viewing angle, the wavelength having interference intensity reaching the maximum value becomes more distant from the emission wavelength region, on the other hand, the wavelength having interference intensity reaching the minimum value does not arrive at the wavelength which has emission intensity reaching the maximum. Thus, while the absolute value of the emission intensity becomes smaller due to the effect of interference, a change in the ratio of emission intensity relative to emission wavelength (form of emission spectrum) is small, thereby color variations due to the viewing angle being suppressed.

In other words, the color variations caused by the viewing angle become larger, when the wavelength which has interference intensity reaching the maximum value or minimum value passes through the wavelength which has emission intensity reaching the maximum. Therefore, it is important that the wavelength which has interference intensity reaching the maximum or minimum value does not become a wavelength which has emission intensity reaching the maximum even if the viewing angle changes.

It should be noted that the longer the wavelength which has interference intensity reaching the extreme value due to variation in viewing angle is, the more the wavelength moves. It moves about 70 nm in the case of blue, while it moves about 140 nm in the case of red. Therefore, assuming that the wavelength which has interference intensity reaching the minimum value at 0 degrees of the viewing angle is $\lambda\text{imin}$, if a relationship of $\lambda\text{emax}+70\text{ nm}\leq\lambda\text{imin}$ is satisfied in the case of a pixel emitting blue, and a relationship of $\lambda\text{emax}+140\text{ nm}\leq\lambda\text{imin}$ is satisfied in the case of a pixel emitting red, then the wavelength having interference intensity reaching the minimum value does not arrive at the wavelength which has emission intensity reaching the maximum, even if the wavelength which has interference intensity reaching the minimum moves to the side of shorter wavelength. Therefore, the variations in the shape of emission spectrum are reduced, thus color variations due to the viewing angle being suppressed.

Moreover, in the display according to the present invention, it is desirable that a relationship of $\lambda\text{emax}-50\text{ nm}\leq\lambda\text{imax}<\lambda\text{emax}$ is satisfied, assuming that the wavelength which has interference intensity reaching the maximum value at 0 degrees of the viewing angle is $\lambda\text{imax}$, and the wavelength which has emission intensity reaching the maximum is $\lambda\text{emax}$.

The reason is that if the wavelength $\lambda\text{imax}$ that has interference intensity reaching the maximum value deviates by 50 nm or over from the wavelength $\lambda\text{emax}$ that has emission intensity reaching the maximum, the emission intensity actually observed by the viewer substantially decreases to about half or below depending on conditions.

Thus, the emission intensity is enhanced by interference in the vicinity of 0 degrees of the viewing angle if the above condition is satisfied, and color variations caused by the viewing angle are suppressed, with a brighter display device being implemented at the same time.

Figure 8:
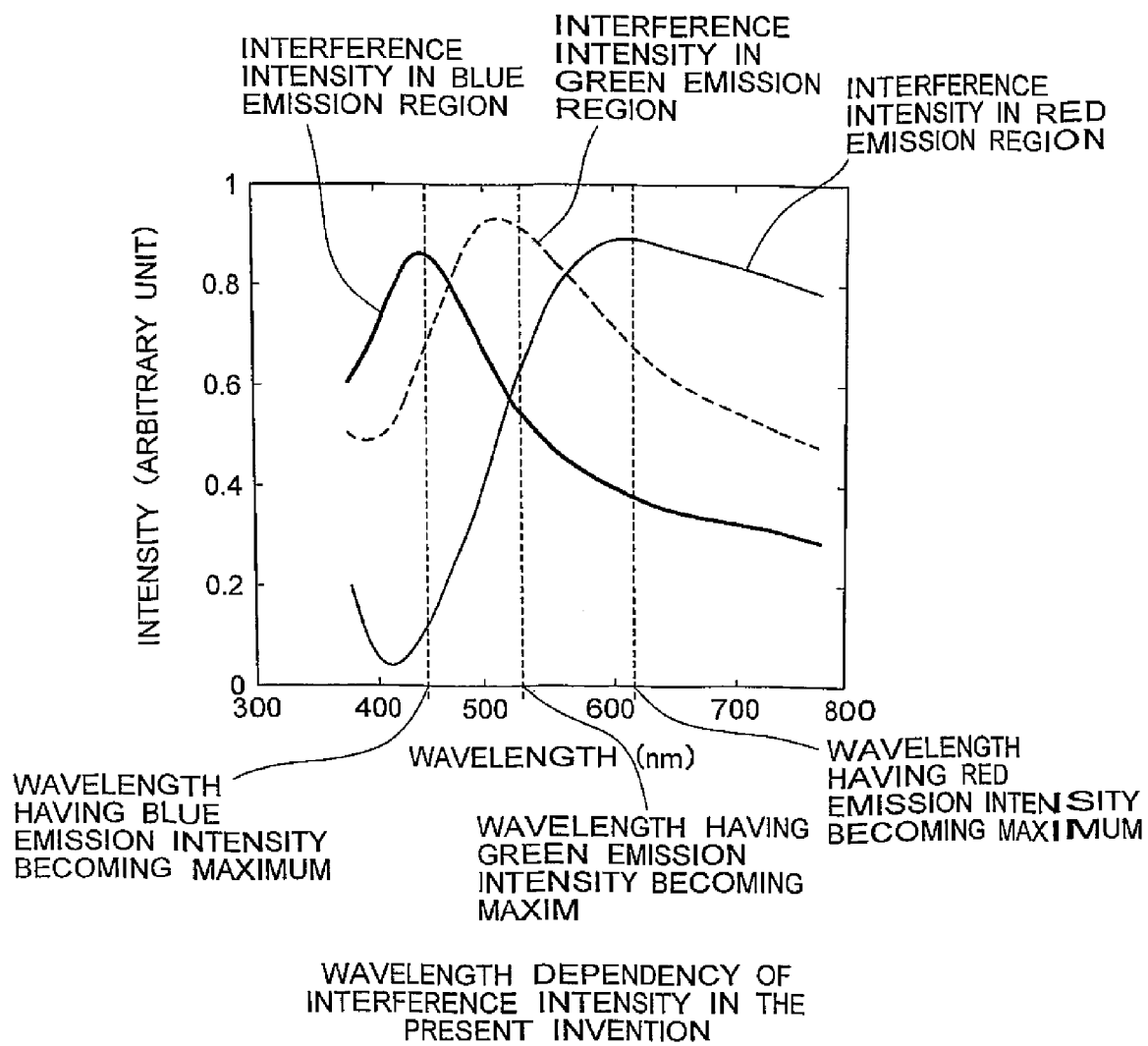
FIG. 8 is a diagram showing a relationship between a wavelength dependency of interference intensity at 0 degrees of the viewing angle and a wavelength which has intensity of light reaching the maximum value in an exemplary embodiment of the display according to the present invention.

FIG. 8 is a diagram showing a relationship between a wavelength dependency of interference intensity at 0 degrees of the viewing angle and the wavelength which has emission intensity reaching the maximum in the present embodiment that satisfies the above condition. As shown in the figure, for a pixel emitting blue, at least films in an emission region are configured such that the wavelength which has interference intensity reaching the maximum value is shorter than the wavelength that is emitted from the blue emissive layer and has intensity of light (also referred to as "emission intensity" below) reaching the maximum. In the same way, for a pixel emitting green, at least films in the emission region are configured such that the wavelength which has interference intensity reaching the maximum value is shorter than the wavelength that has green emission intensity reaching the maximum. Similarly, for a pixel emitting red, at least films in emission region are configured such that the wavelength which has interference intensity reaching the maximum value is shorter than the wavelength that has red emission intensity reaching the maximum.

Moreover, the wavelength which has interference intensity reaching the minimum value at 0 degrees of the viewing angle does not exist in a visible wavelength range in which the wavelength is longer than that having emission intensity reaching the maximum, and $\lambda\text{emax}-50\text{ nm}\leq\lambda\text{imax}<\lambda\text{emax}$ is satisfied in emission regions of pixels for each color.

Specifically, for the pixel emitting blue, the film thickness is set such that the wavelength which has interference intensity reaching the maximum value is 445 nm, while the wavelength which has emission intensity reaching the maximum is 450 nm. For the pixel emitting green, the film thickness is set such that the wavelength which has interference intensity reaching the maximum value is 515 nm, while the wavelength which has emission intensity reaching the maximum value is 525 nm. Furthermore, for the pixel emitting red, the film thickness is set such that the wavelength which has interference intensity reaching the maximum value is 610 nm, while the wavelength which has emission intensity reaching the maximum is 615 nm. Therefore, it is appreciated that the interference intensity varies with the film thickness.

The thickness of the film of a blue pixel achieving these interference conditions is designed such that film thickness of the transparent electrode 200 is 80 nm, and that of the organic film 100 is 85 nm in the emission region 61. The breakdown for the film thickness of the organic film 100 is as follows: the summed thickness of a hole injection layer and a hole transporting layer is 40 nm, that of emissive layer is 25 nm, and that of electron transporting layer is 20 nm.

Similarly, the thickness of the film of a green pixel is designed such that film thickness of the transparent electrode 200 is 90 nm, and that of the organic film 100 is 115 nm in the emission region 61. The breakdown for film thickness of the organic film 100 is as follows: the summed film thickness of a hole injection layer and a hole transporting layer is 40 nm, that of emissive layer is 45 nm, and that of electron transporting layer is 30 nm.

In the same way, the thickness of the film of a red pixel is designed such that film thickness of the transparent electrode 200 is 80 nm, and that of the organic film 100 is 155 nm in the emission region 61. The breakdown for film thickness of the organic film 100 is as follows: the summed film thickness of a hole injection layer and a hole transporting layer is 40 nm, that of emissive layer is 30 nm, and that of electron transporting layer is 85 nm.

It should be noted that a film thickness condition for the hole transporting layer and hole injection layer, which constitute the organic film 100, is not changed for each emission color and is set to 40 nm in the pixels of all colors in the present embodiment, thus improving throughput.

Moreover, assuming that the thickness RT of the organic film in the emission region of red pixel is 155 nm, the thickness GT of the organic film in the emission region of green pixel is 115 nm, and the thickness BT of the organic film in the emission region of blue pixel is 85 nm, then a relationship of $RT \geqq GT \geqq BT$ is satisfied. This is based on that the wavelength having the interference intensity reaching the maximum value moves to the longer wavelength side if the thickness of the hole transporting layer, hole injection layer, or electron transporting layer becomes thicker. In other words, when enhancing the emission intensity by means of the interference effect while suppressing the color variations caused by the viewing angle, increasing the thickness of the organic film is more effective to the color with longer emission wavelength.

Figure 9:
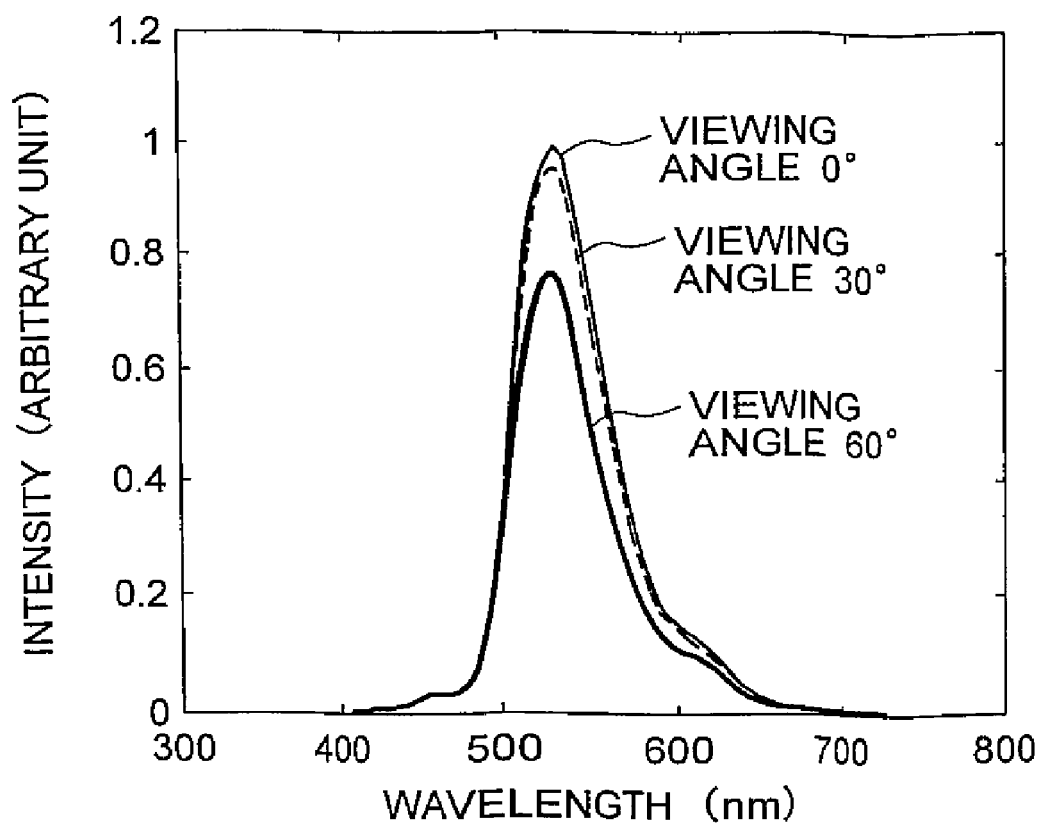
FIG. 9 is a diagram showing an example of a viewing angle dependency of an emission spectrum of the display according to the present invention.

FIG. 9 shows an emission spectrum of the OLED display of the present embodiment. It shows a viewing angle dependency of a green emission spectrum. As the figure shows, in the present embodiment, while the absolute value of emission intensity decreases as the viewing angle increases, the ratio of emission intensity to the wavelength or the variation of the form of emission spectrum, is small. Therefore, as the viewing angle increases, the emission intensity decreases, resulting in a darkened display. However, the color variations are suppressed.

More specifically, in the light-emitting display according to the present invention, the intensity of light that is emitted from the emissive layer and taken out to the viewer reaches the maximum at 0 degrees of the viewing angle, and becomes smaller with an increase in the viewing angle. More precisely, the wavelength that is emitted from the emissive layer and taken out to the viewer side has light intensity which reaches the maximum at 0 degrees of the viewing angle, and decreases with the increase in viewing angle. Moreover, the amount of the variation of the wavelength, which is taken out from the light-emitting display to the viewer side and has the intensity of light reaching the maximum, is small, such as 10 nm or below, even if the viewing angle changes from 0 to 60 degrees.

This is because the wavelength, which has interference intensity reaching the maximum value with an increase in the viewing angle, moves to the short wavelength side and thereby becomes more distant from the wavelength which has emission intensity reaching the maximum. Therefore, in the light-emitting display according to the present invention, the variation in the form of the emission spectrum is small, even if the viewing angle changes, thus making it possible to suppress color variations.

Figure 10:
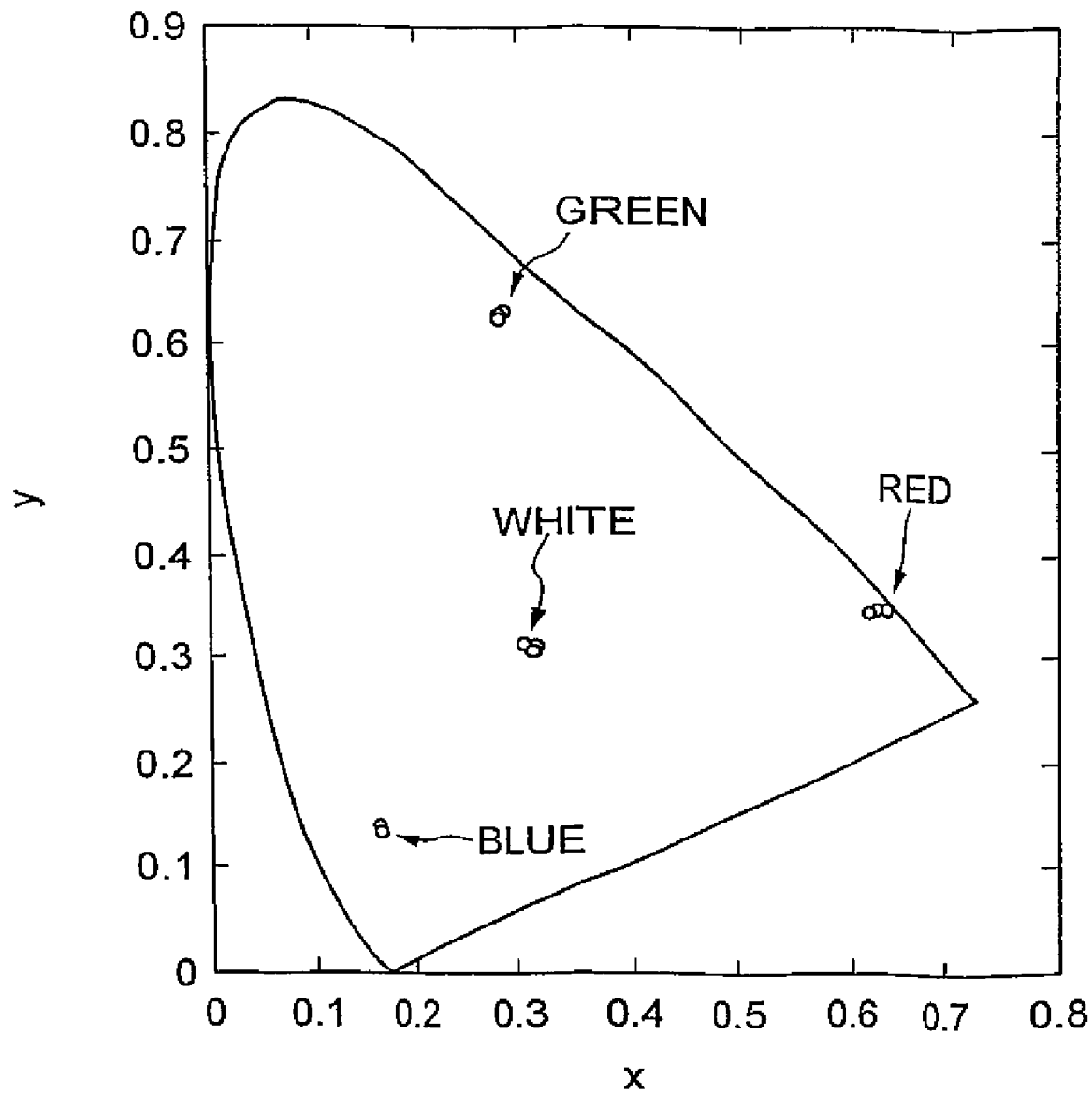
FIG. 10 is a diagram showing a viewing angle dependency of chromaticity in an exemplary embodiment of the display according to the present invention.

FIG. 10 is a diagram showing a viewing angle dependency of chromaticity of the OLED display of the present embodiment. In the diagram, the chromaticity is plotted in 15 degrees interval in viewing angle from 0 to 75 degrees when displaying the three primary colors of red, green and blue, and white.

Figure 19:
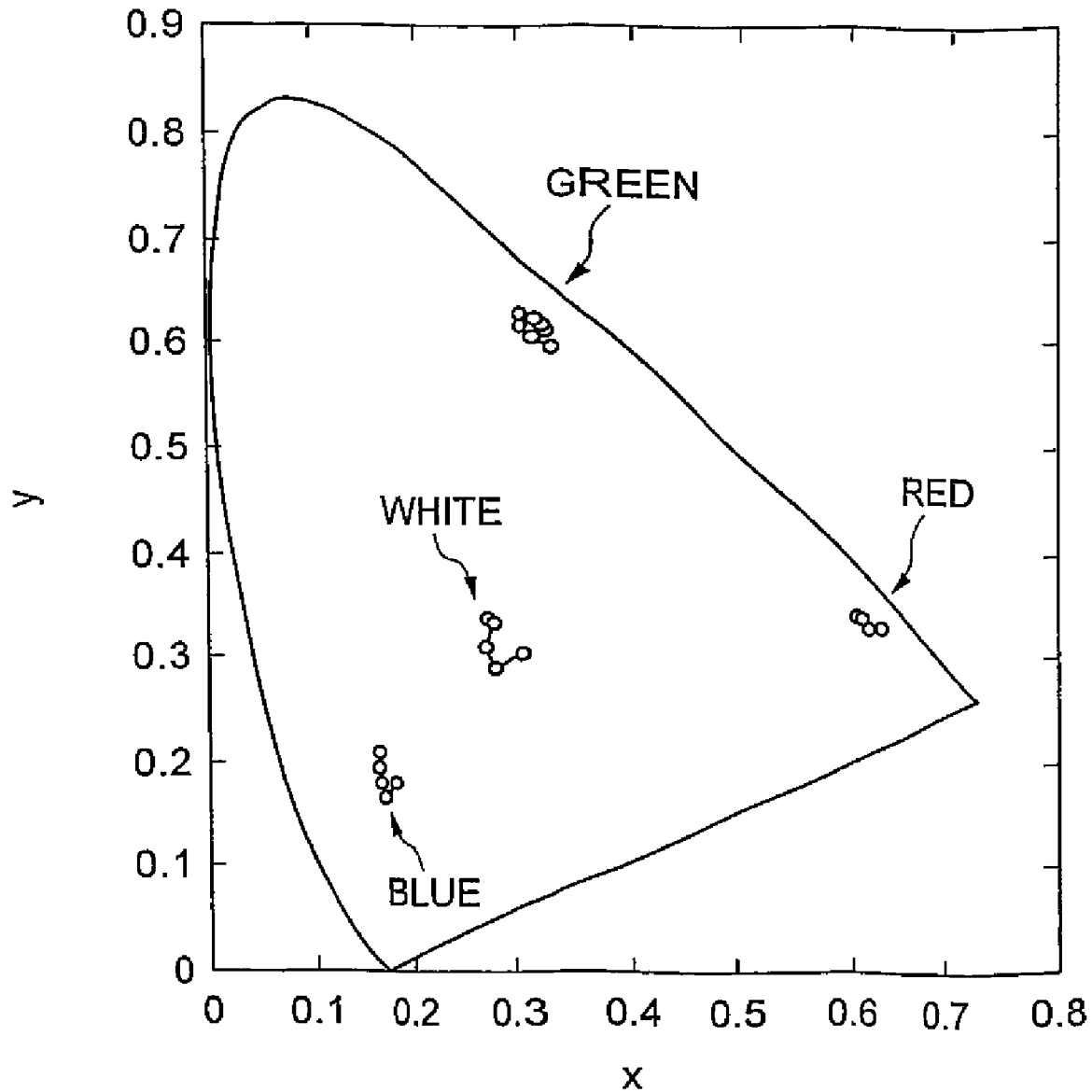
FIG. 19 is a diagram showing an exemplary viewing angle dependency of chromaticity of the conventional display.
Figure 20:
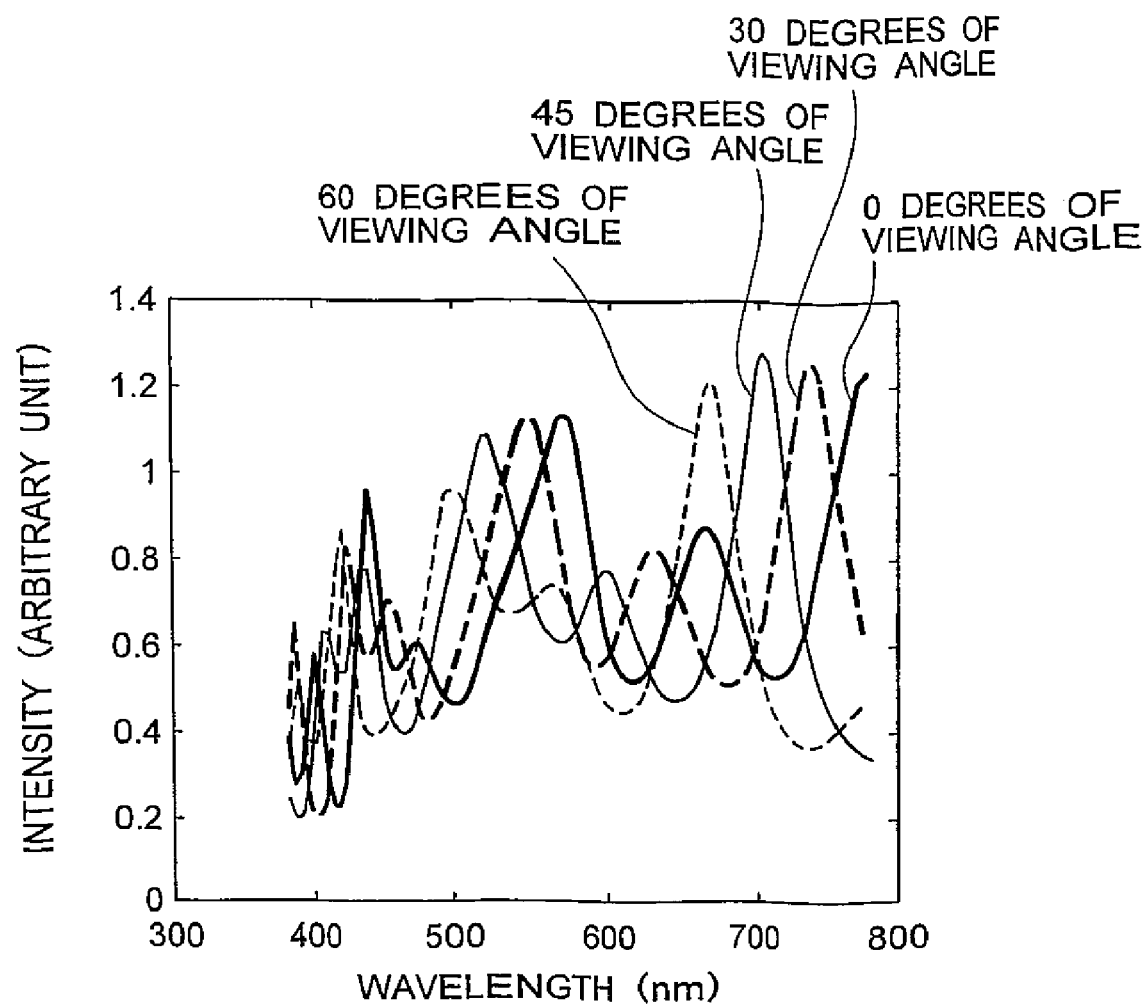
FIG. 20 is a diagram showing an exemplary result of making a trial calculation of a viewing angle dependency of interference intensity of the conventional display.

Compared with a viewing angle dependency of chromaticity of a conventional OLED display illustrated in FIG. 19 that uses the same emission material as that of the present embodiment, it will be recognized that the chromaticity variation due to the viewing angle is small in the present embodiment. For example, in the present embodiment the value of chromaticity difference $\Delta xy$ of white is reduced to 0.01 against 0.05 in the conventional one.

In order to satisfy the above condition of interference intensity, it is very important to remove a foundation layer and an interlayer insulating layer at least the emission region of a pixel as in the present embodiment. If there exist a foundation layer, an interlayer insulating layer, and the like in the emission region as in a conventional active matrix drive OLED display, a reflection occurs on an interface between layers of different refractive indexes out of these layers, and a spacing between the wavelengths that have interference intensity reaching the extreme value (maximum or minimum value) becomes shorter due to the interference caused by the reflection. Therefore, a plurality of wavelengths which have interference intensity reaching the extreme values appear in the visible wavelength range, thus making it impossible to satisfy the condition of the interference intensity relating to the present invention. This phenomenon may sometimes go beyond control by changing the film condition of the light-emitting diode device.

Thus, it is necessary to reduce the interface of different refractive indexes by removing the foundation film and interlayer insulating layer in the emission region and to reduce the number of reflection interfaces and the entire film thickness so as to control the condition of interference. In other words, it is important to remove the film which is unnecessary for the operation of the light-emitting device in the emission region, and to ensure a control margin for the wavelength which has interference intensity reaching the extreme value as in the present embodiment.

When removing the film that is unnecessary for the operation of the light-emitting device, if the switching device is composed of low temperature polysilicon TFT, it is desirable to pay attention to following points.

It is desirable to form an ion blocking film for blocking ion from a transparent substrate at least in a region where the switching device is formed. Further, it is desirable that the switching device is surrounded in every direction by a film having properties to block ion. This is to be prevented from a problem that a threshold is changed by ion such as Na, or K, which mixes in from the transparent substrate, and further to be prevented from the mixing of ion into a new admission path which is formed by removing the foundation film in the emission region.

A dense film is appropriate for the ion blocking film. For example, SiNx is suitable. Referring to FIG. 1, the switching device (driving transistor 10 in the figure) is configured to be surrounded in every direction by a first foundation film 11 and a second interlayer insulating layer 20 which include SiNx in the present embodiment, thus avoiding the mixing in of ion. This also avoids the variation of threshold voltage of TFT caused by the mixing in of ion in the present invention.

Furthermore, in the present embodiment, the removal of the foundation film and interlayer insulating layer in the region corresponding to the emission region can be prevented from the occurrence of warp in the substrate due to membrane stress and the occurrence of micro-cracks.

In the above embodiment, description is given on the case in which the condition of interference intensity indicated in the present invention is applied to the emission regions of the pixels for all of red, green and blue. It is desirable, of course, that the condition of interference intensity according to the present invention is applied to the emission regions of pixels for all colors in order to suppress the variation in color due to the change in viewing angle. However, it should be noted that the present invention does not omit a case in which the condition of interference intensity according to the present invention is applied only to the emission region of the pixel of at least one color in the light-emitting display including a plurality of pixels, each of which emits light of different colors.

Furthermore, while in the above embodiment, description is given on the case in which there exists only one maximum value of interference intensity in the visible wavelength range, the present invention is not limited to that. For example, with the red pixel, it does not pose a problem if there exist a plurality of extreme values of interference intensity on the side of the wavelength shorter than that has emission intensity reaching the maximum.

Figure 11:
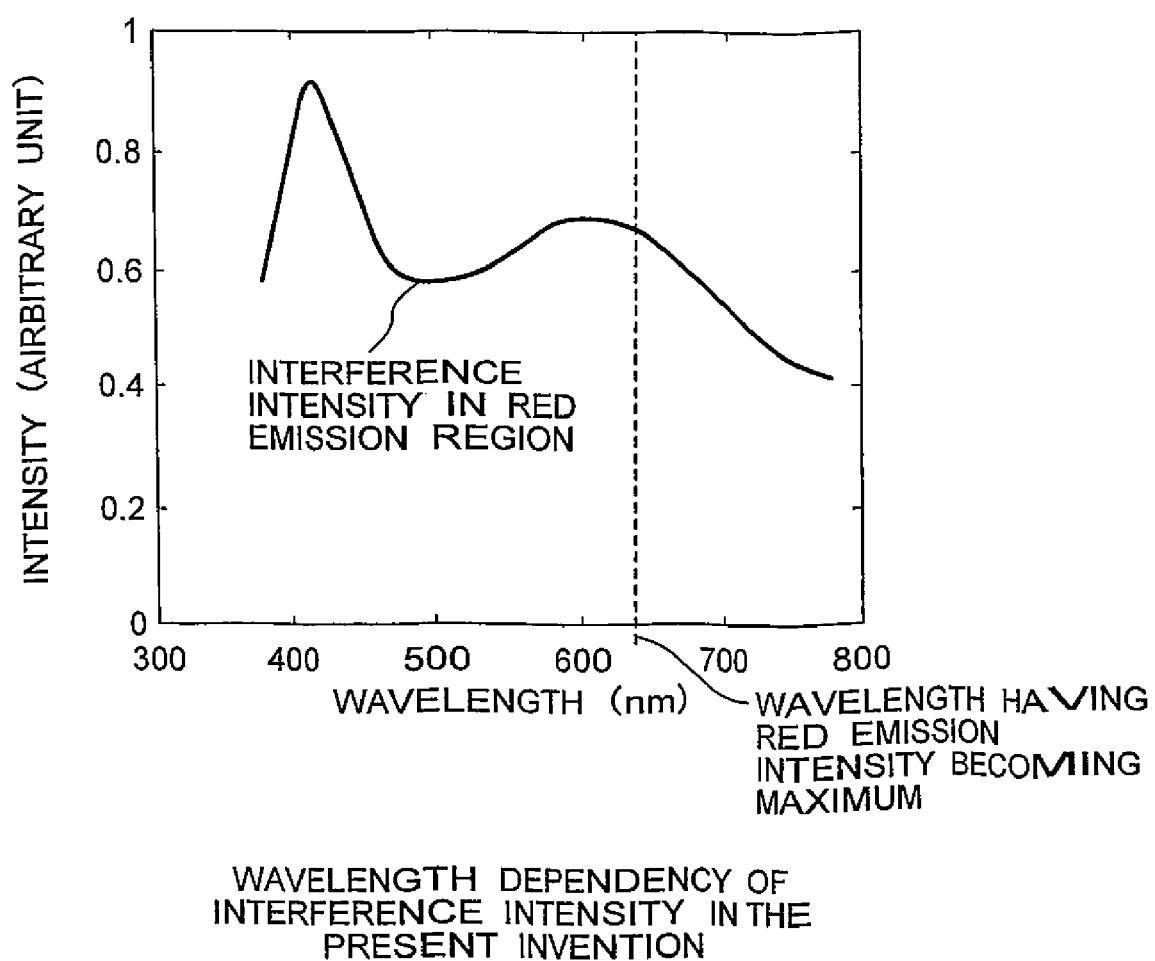
FIG. 11 is a diagram showing a relationship between a wavelength dependency of interference intensity in an emission region of a red light emitting pixel at 0 degrees of the viewing angle and a wavelength which has intensity of red light reaching the maximum value in an exemplary embodiment of the display according to the present invention.

FIG. 11 is a diagram showing a relationship between a wavelength dependency of the interference intensity and the wavelength which has emission intensity reaching the maximum at 0 degrees of the viewing angle in the emission region of the pixel emitting red. As shown in the figure, for a pixel emitting red, even if there exist a plurality of extreme values of interference intensity in the visible wavelength range, they may be on the side of wavelength shorter than that which has emission intensity reaching the maximum, thus making it possible to satisfy the condition of interference intensity relating to the present invention.

Figure 12:
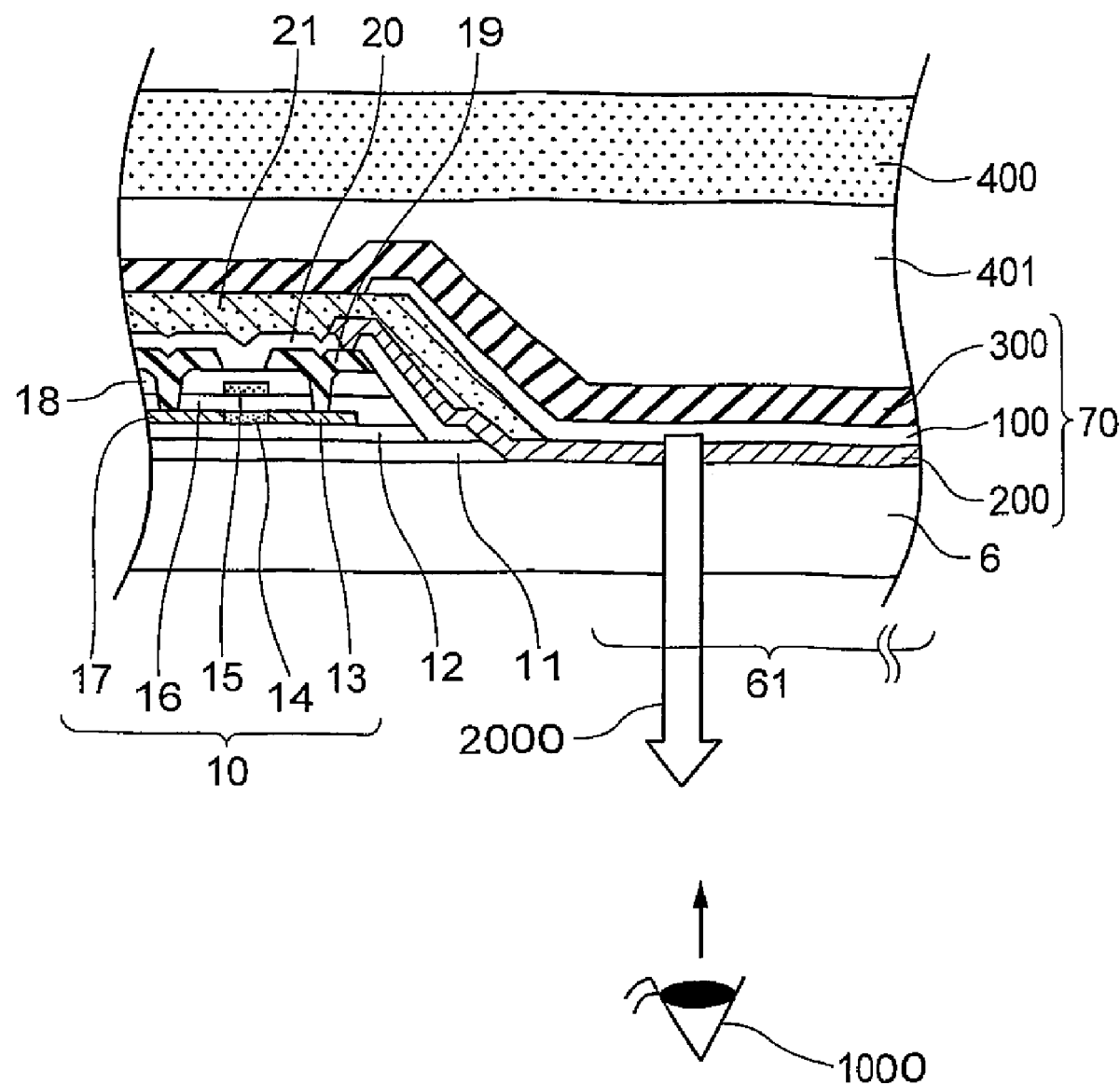
FIG. 12 is a schematic cross-sectional view in the vicinity of one pixel illustrating a configuration of an exemplary embodiment of the display according to the present invention.

Next, another embodiment of the present invention will be described. FIG. 12 is a schematic cross sectional diagram in the vicinity of a pixel illustrating a cross sectional structure of the display of the present invention, in which like reference numerals are used to parts similar to those in the above embodiments and detailed description thereof is omitted. In the embodiment shown in FIG. 1, in order to avoid the possibility of a broken wire at the time when the transparent electrode 200 climbs over a step including the first interlayer insulating layer 18, gate insulation layer 16 and second foundation film 12, the source/drain electrode layer 19 is configured to climb over the step including the first interlayer insulating layer 18, gate insulation layer 16 and second foundation film 12.

In contrast, in the present embodiment, as shown in FIG. 12, the transparent electrode 200 climbs over the step including the first interlayer insulating layer 18, gate insulation layer 16 and second foundation film 12, and is connected to the drain electrode via the source/drain electrode layer 19. In this case, the end faces of the first interlayer insulating layer 18, gate insulation layer 16, second foundation film 12, first foundation film 11 and second interlayer insulating layer 20 are processed to be gradual slopes by controlling etching conditions.

In the present embodiment, since the source/drain electrode 19 is not long drawn out, a wider emission region 61 is secured. In also this case, since the switching device is surrounded in every direction by the first foundation film 11 and second interlayer insulating layer 20 including SiNx, the mixing in of ion is avoided, thus making it possible to avoid the variation of threshold of TFT.

Figure 13:
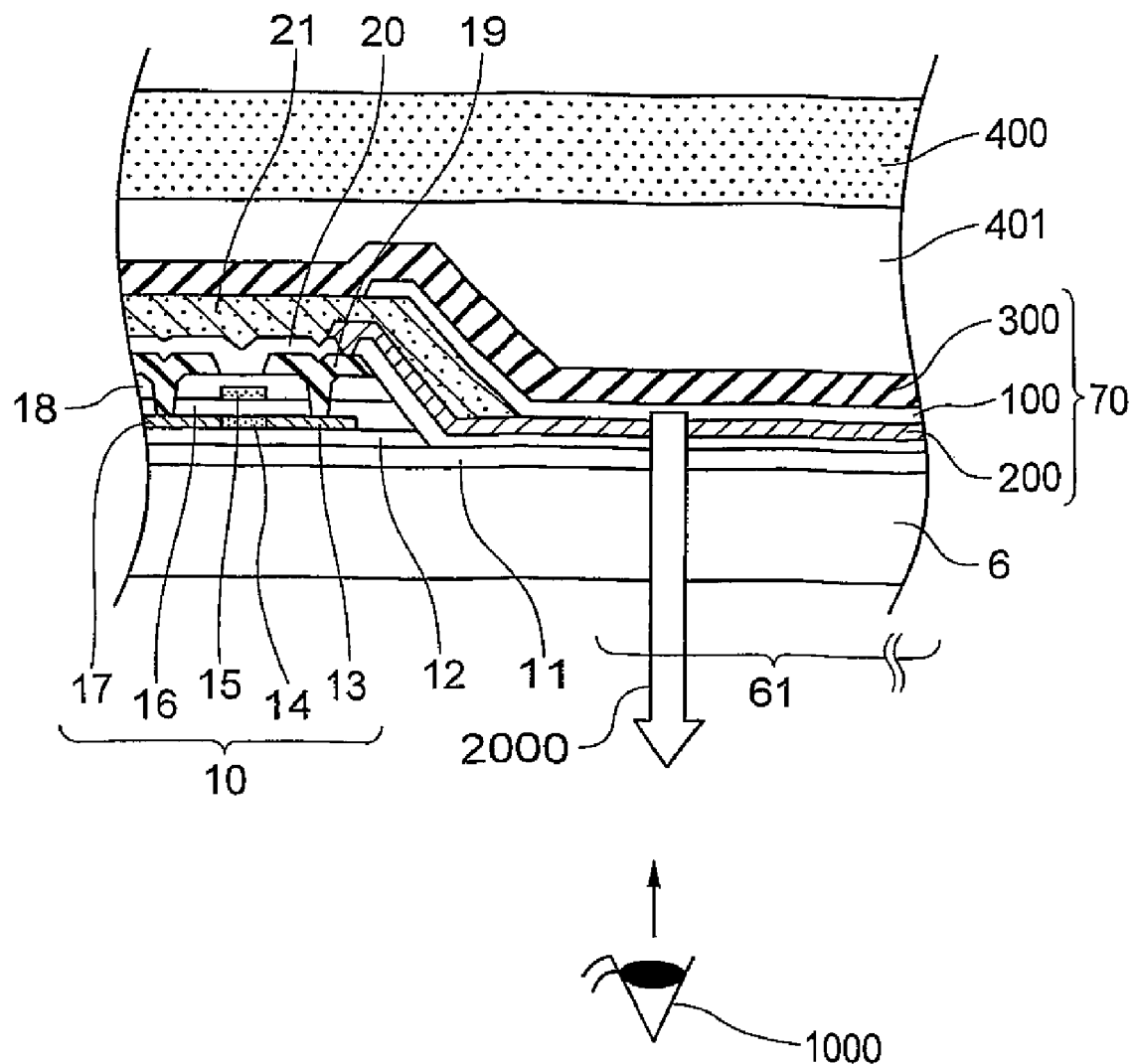
FIG. 13 is a schematic cross-sectional view in the vicinity of one pixel illustrating a configuration of an exemplary embodiment of the display according to the present invention.

Next, another embodiment of the present invention will be described. FIG. 13 is a schematic cross sectional diagram in the vicinity of a pixel illustrating a cross sectional structure of the display of the present invention, in which like reference numerals are used to parts similar to those in the above embodiments and detailed description thereof is omitted. In the embodiment, while the second foundation film 12, gate insulation film 16 and first interlayer insulating layer 18 are removed in the emission region 61 of the pixel, the first foundation film 11 and second interlayer insulating layer 20 are not removed.

In the above embodiment, in order to satisfy the interference condition relating to the present invention, the foundation film and interlayer insulating layer are removed in at least the emission region of the pixel. However, the present invention is not limited to the construction. If the interference condition relating to the present invention is satisfied, all of the foundation films and interlayer insulating layers need not be removed.

In the present embodiment, the first foundation film 11 and second interlayer insulating layer 20, that contain SiNx having a relatively small refractive index difference against the transparent electrode 200 that includes ITO, are not removed, while the second foundation film 12, gate insulation film 16 and first interlayer insulating layer 18, that contain SiOx having a large refractive index difference against the transparent electrode 200, are removed from the region corresponding to the emission region.

In this situation, since the films containing SiOx are removed, the large refractive index difference exists only on an interface between the first foundation film 11 and transparent substrate 6, the number of reflection planes and the entire film thickness are reduced. Therefore, it becomes possible to widen the spacing of the wavelengths having interference intensity reaching the extreme value (maximum value or minimum value), and to reduce the color variations caused by the viewing angle by controlling the interference condition with the thickness of the film constituting the light-emitting device.

It should be noted that since the first foundation film 11 and second interlayer insulating layer 20 that contain SiNx having properties to block ion are not removed from the emission region, the switching device (driving transistor 10 in the figure) is covered with the film having properties to block ion, thus making it possible to avoid variation of threshold of TFT caused by the mixing in of ion in the present embodiment. Moreover, the way of removing only part of the films as in the present embodiment improves throughput and productivity more than the way of removing all foundation films and interlayer insulating layers from the emission region.

Here, when selecting the film out of the foundation films and interlayer insulating layers that is to be removed from the emission region, one having a refractive index difference of 0.4 or more against the transparent electrode 200 or transparent substrate 6 should be considered. The reason is that there may occur a significant reflection of 2 to 3% reflectance on the interface of a film having a refractive index difference of 0.4 or over. If the film is removed, the number of reflection planes and the entire film thickness are reduced, thus making it more effective to expand the margin of controlling interference condition.

Figure 14:
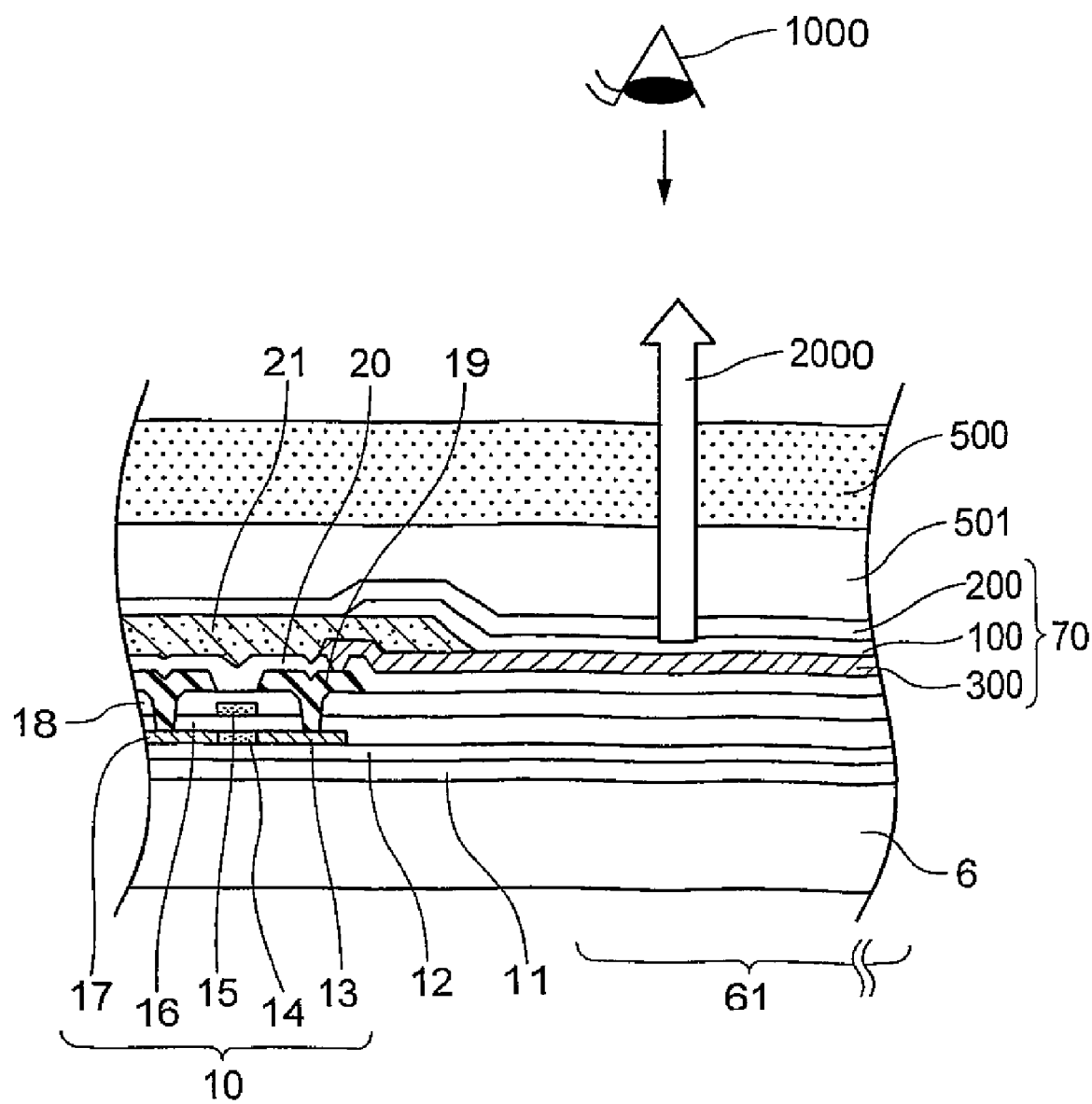
FIG. 14 is a schematic cross-sectional view in the vicinity of one pixel illustrating a configuration of an exemplary embodiment of the display according to the present invention.

Next, another embodiment of the present invention will be described. FIG. 14 is a schematic cross sectional diagram in the vicinity of a pixel illustrating a cross sectional structure of the display of the present invention, in which like reference numerals are used to parts similar to those in the above embodiment and detailed description thereof is omitted.

The present embodiment relates to a so-called top emission type OLED display device, in which light is taken out from a side opposite to the substrate 6 where organic light-emitting diode device 70 is formed. The reflective electrode 300 constituting the organic light-emitting diode device 70 is connected to the driving transistor 10. When the reflective electrode 300 functions as a cathode, the driving transistor 10 should be an N channel type TFT.

In this case, the light 2000 emitted from the emissive layer does not directly enter the gate insulation layer 16 constituting the switching device, first and second interlayer insulating layers 18, 20, and first and second foundation films 11, 12. Therefore, it is unnecessary to remove these films in the emission region. Moreover, since the light emitted from the emissive layer need not pass through the substrate 6 when traveling towards the viewer 1000, the substrate dose not necessarily need to be transparent.

Color variations due to the viewing angle are also controlled by forming the film that satisfies the interference condition relating to the present invention in the top emission type OLED display device.

For the top emission type OLED display device, a transparent sealing member 500, which is transparent to visible light and has gas barrier properties, and a substrate 6 are hermetically sealed around the display area of the display device by applying an adhesive sealing agent in a frame form. A glass board, a resin film that is subjected to gas barrier processing, a stacked thin glass board and a resin film or the like may be used for the transparent sealing member 500.

In this situation, it is desirable that the gap 501 between the transparent sealing member 500 and substrate 6 is filled with a transparent material having a refractive index of about 1.4 to 2.0 such that a refractive index difference between the gap 501 and the sealing member or transparent electrode may be reduced. The reason is to reduce the reflection occurring on the interface between the transparent electrode 200 and gap 501, or the interface between the gap 501 and transparent sealing member 500, and thereby to reduce the effect of reflection on these interfaces that may exert on the interference intensity.

More specifically, if the reflection on the interfaces is reduced, then the interference intensity is reduced, thereby the difference between the maximum value and minimum value of interference intensity being reduced. This reduces the variation in the amount of interference intensity due to the viewing angle, and variation in the form of emission spectrum, thus color variations due to the viewing angle being suppressed.

In particular, if the thickness of the transparent material is configured to be thicker than a coherence length, for example 30 μnm or over, the affection of the interference is more reduced, thus the color variations due to the viewing angle being more reduced.

Instead of using the transparent sealing material as above, an inorganic transparent material having gas barrier properties may be stacked and formed on the transparent electrode 200. The transparent electrode 200 may be sealed with a film having the gas barrier properties. The film having the gas barrier properties is made by alternately stacking an inorganic transparent material and an organic transparent material. In this situation, it is desirable that the film is configured not to reach the atmosphere from the transparent electrode 200 so as to avoid the affection of the atmosphere on the interference intensity. In other words, it is desirable that the film on the transparent electrode 200 is configured with less affection on the interference intensity.

When stacking different materials, for example, it is desirable that materials having a small refractive index difference between them are selected to reduce affection on the interference intensity, and the film thickness is designed to be thicker than the coherence length, for example 30 μm or over, to avoid the affection on the interference intensity.

Next, another embodiment of the present invention will be described. For full colorization of an OLED display, several approaches have been proposed and demonstrated. In addition to the approach of directly patterning pixels including a light-emitting device of the three prime colors (red, green and blue) as in the above embodiment, an approach for combining a white emission and a color filter for the three prime colors of red, green and blue (an RGB by white method hereinafter) has been proposed. The RGB by white method has an advantage that manufacturing is easy, since only one emissive layer for white has to be created.

In the display of the present embodiment, all the organic films are made to be organic films for emitting white. In the above embodiment, they were colored separately for red emission, green emission and blue emission. Moreover, in the present embodiment, a color filter for allowing red light to pass through is provided for a pixel for emitting red, a color filter for allowing green light to pass through is provided for a pixel for emitting green, and a color filter for allowing blue light to pass through is provided for a pixel for emitting blue on the side of the light-emitting device from which light is taken out. Since a configuration other than the above is the same as that of the above embodiments, a detailed description on similar parts is omitted. The color filters may be colored separately according to a known method, such as a dying method, a pigment-dispersed photolithography method, a printing method, or the like.

The configuration of the organic filter for emitting white light includes stacking a plurality of emissive layers that emit different colors, and doping coloring matters that emit different colors in one emissive layer.

As an example of the former configuration, there may be used TPD and Alq3 having Alq3 is partially doped with nile red and combined with 1,2,4-triazole derivatives (TAZ). The latter configuration includes, for example, PVK doped with three kinds of coloring matters, for example, 1,1,4,4,-tetraphenyl 1,3-butadiene (TPB), coumarin 6, and DCM1. In either case, it is desirable to use a material that is superior in light-emitting efficiency, and provides long-lived white emission.

Figure 15:
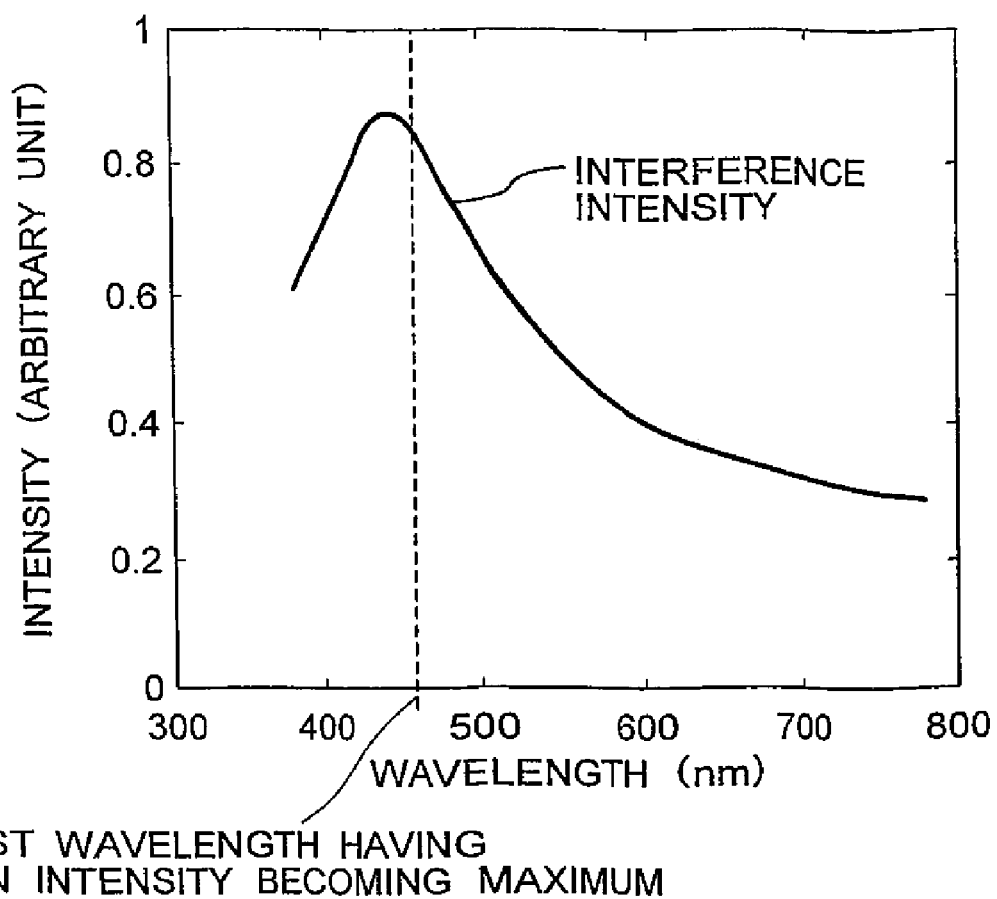
FIG. 15 is a diagram showing a relationship between a wavelength dependency of interference intensity at 0 degrees of the viewing angle and a shortest wavelength which has emission intensity reaching the maximum value in an exemplary embodiment of the display according to the present invention.
Figure 16:
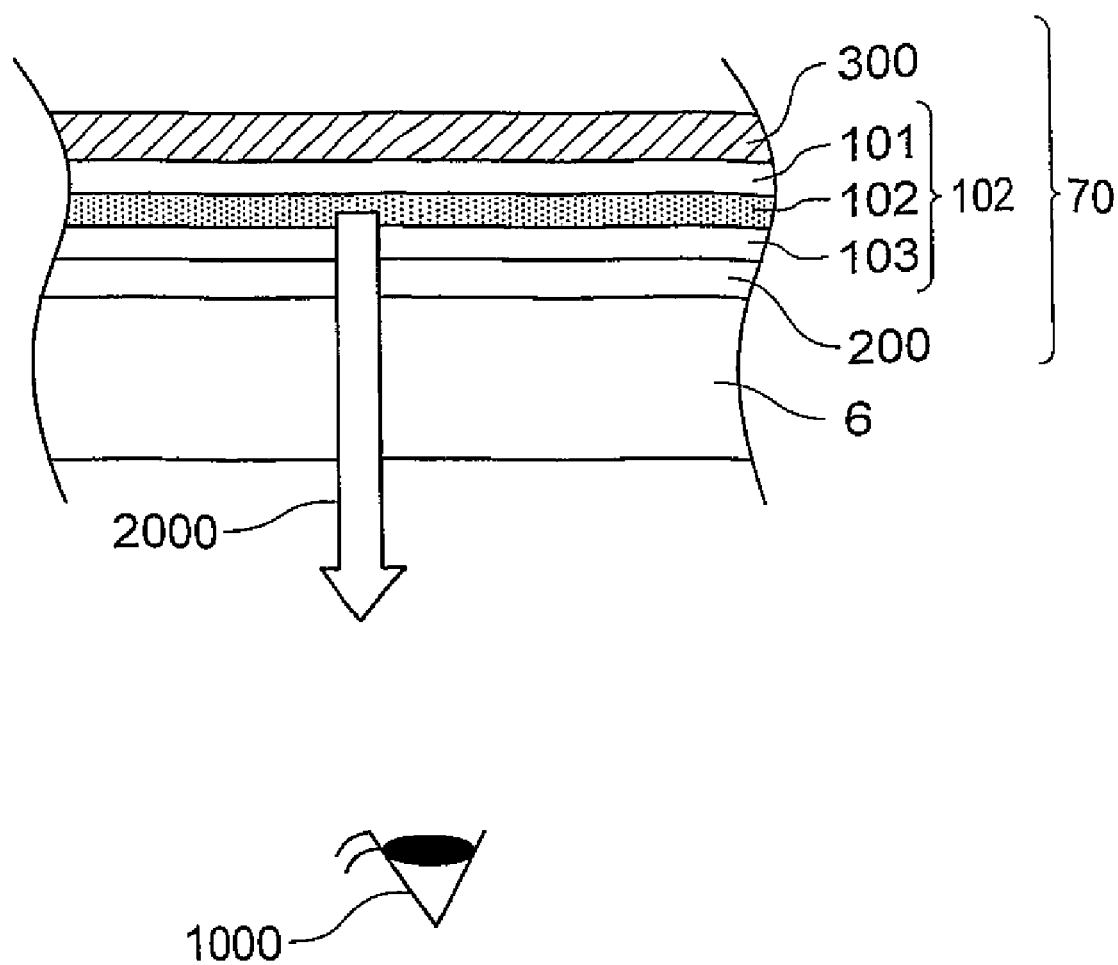
FIG. 16 is a partially schematic cross-sectional view showing an exemplary conventional organic light-emitting diode device.
Figure 17:
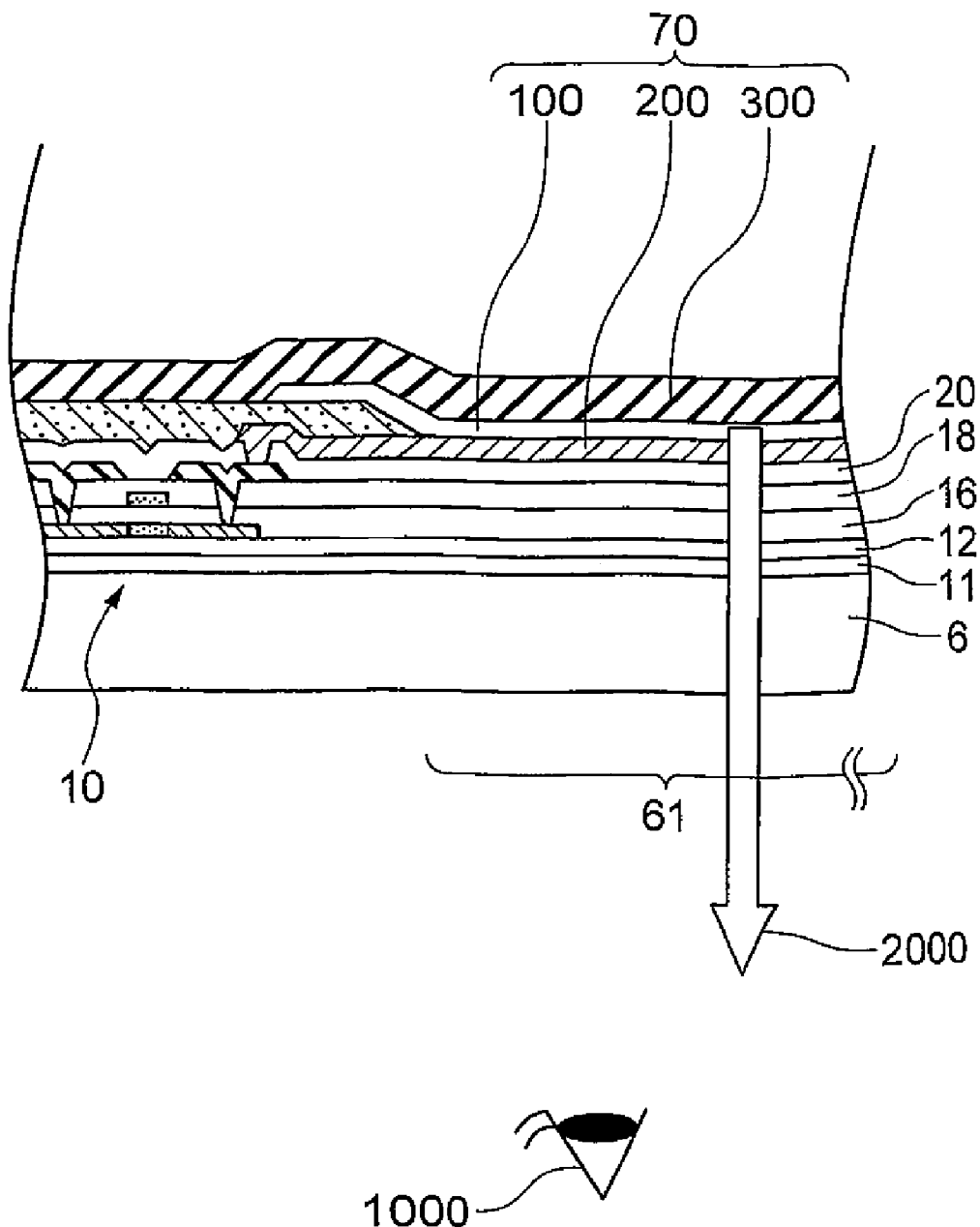
FIG. 17 is a schematic cross-sectional view in the vicinity of a pixel of a conventional display.
Figure 18:
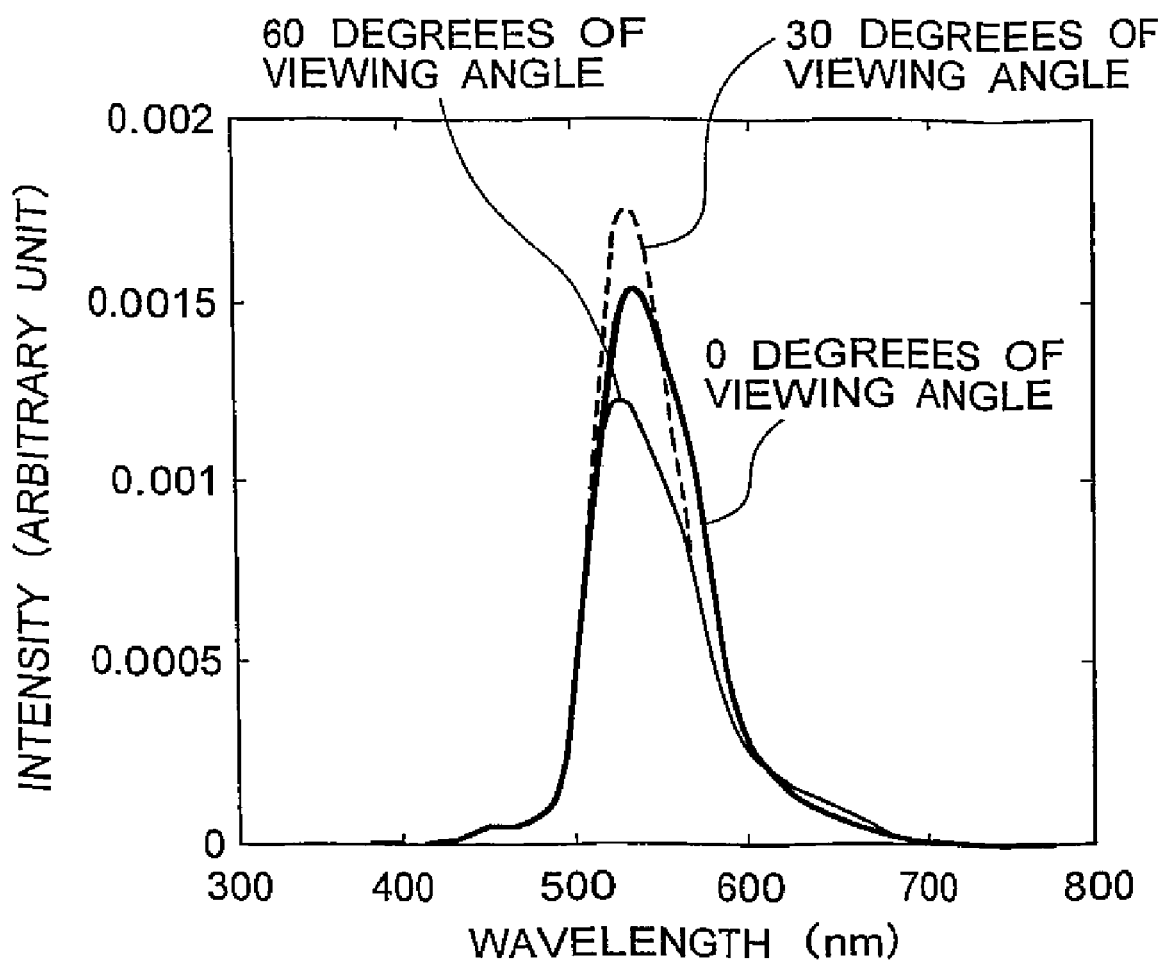
FIG. 18 is a diagram showing an exemplary viewing angle dependency of an emission spectrum of the conventional display.

FIG. 15 is a diagram showing a relationship between a wavelength dependency of interference intensity and a shortest wavelength having emission intensity reaching the maximum value. The organic light-emitting diode device that emits white light has a plurality of maximum values which exist in a visible wavelength range.

Therefore, in order to reduce the color variations due to the viewing angle, it is necessary that wavelength which has the interference intensity reaching the extreme value does not overlap on the wavelength which has the emission intensity reaching the maximum value. For this reason, it is desirable that the wavelength which has the interference intensity reaching the maximum value at 0 degrees of the viewing angle is shorter than the shortest wavelength that has the emission intensity reaching the maximum value, and the wavelength which has the interference intensity reaching the minimum value does not exist in the visible wavelength range.

In this situation, similar to the embodiment described above, while the maximum value and minimum value of the interference intensity moves to the short wavelength side with an increase of the viewing angle, they do not move to the emission wavelength range even if the viewing angle increases. Accordingly, the form of the emission spectrum is hardly changed, thus making it possible to suppress the color variations even if the viewing angle changes.

It should be noted that the OLED display in the embodiments which have been described above may be provided with a so-called circular polarizing film including a polarizing film and a quarter wave film as a means for suppressing ambient light reflection. The circular polarizing film should be disposed to the viewer side of the transparent substrate in the case of the bottom emission type OLED display. It should be disposed to the viewer side of the transparent sealing member in the case of the top emission type OLED display. The OLED display provided with the circular polarizing film can reduce the reflection of ambient light such as from line, reflective electrode or the like by the action of the circular polarizing film, thus making it possible to achieve a high contrast ratio even under light environment.

The pixels that constitute the display area of the display may be disposed in either way, including a stripe arrangement, a mosaic arrangement, a delta arrangement or the like. The arrangement type may be selected according to the specification of the display.

It should be recognized that the present invention is not limited to the above embodiments, and various modifications may naturally be made without departing from the technical concept that satisfies the conditions of the interference intensity defined in the present invention.

Thus, the present invention is not limited to the active matrix drive OLED display described above. Specifically, the present invention may be applied to a passive matrix drive display in which electrodes of light-emitting devices are directly connected to a vertical scan line, and a horizontal scan line for driving without being provided with a switching device, such as TFT, or the like. The light-emitting device may also be applied not only to the organic light-emitting diode device, but also to an inorganic electroluminescence device.

As described above, according to the present invention, it is possible to implement a display that includes the light-emitting devices which are affected by optical interference, such as the organic light-emitting diode devices, and is possible to decrease color variations even if the viewing angle changes.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An active-matrix type color light-emitting display apparatus comprising:
   a plurality of light-emitting elements which are arranged in matrix and emit white light,
   a transparent substrate,
   a plurality of switching elements which control lightings of said light-emitting element formed in said transparent substrate,
   a color filter which said white light from said light-emitting elements is incident thereon and transmits red light,
   a color filter which said white light from said light-emitting elements is incident thereon and transmits green light, and
   a color filter which said white light from said light-emitting elements is incident thereon and transmits blue light, wherein
   a wavelength of light, at which an interference intensity of light emitted from an emissive layer constituting said light-emitting elements becomes a maximum at 0 degree of a viewing angle, is shorter than a shortest wavelength, at which an intensity of the light emitted from said emissive layer becomes a maximum in a visible wavelength range.

2. An active-matrix type color light emitting display apparatus according to claim 1, wherein a wavelength at which an interference intensity of light becomes a minimum is not present in the visible wavelength range.

3. An active-matrix type color light-emitting display apparatus according to claim 1, wherein said light-emitting elements are formed by stacking a plurality of emissive layers which emit different colors, thereby white color is emitted.

4. An active-matrix type color light-emitting display apparatus according to claim 1, wherein said light-emitting element are formed by doping coloring matters which emit different colors into one emissive layer, thereby white color is emitted.

5. A color light emitting display including light-emitting devices constituting a plurality of red, green and blue pixels disposed in a matrix form,
   wherein said light emitting display is of taking out a light from a side opposite to a substrate on which said light-emitting devices are formed,
   wherein a wavelength of the light, of which an interference intensity to the light emitted from an emissive layer constituting said light-emitting device becomes a maximum value at 0 degree of a viewing angle is $\lambda imax$, a wavelength of the light becoming a minimum value in the interference intensity is $\lambda imin$ and a wavelength of the light becoming a maximum in a light intensity in relation to the light emitted from said emissive layer is $\lambda emax$, a relationship of $\lambda imax < \lambda emax$ and $\lambda imin \geq \lambda emax + 70$ nm is satisfied, and
   wherein a case where a thickness of an organic film constituting said organic light-emitting diode device is RT in a red pixel, GT in a green pixel, and BT in a blue pixel, a relationship of $RT \geq GT \geq BT$ is satisfied.

6. A color light emitting display including light-emitting devices constituting a plurality of red, green and blue pixels disposed in a matrix form,
   wherein said light emitting display is of taking out a light from a side opposite to a substrate on which said light-emitting devices are formed, wherein a wavelength of the light, of which an interference intensity to the light emitted from an emissive layer constituting said light-emitting device becomes a maximum value at 0 degree of a viewing angle is $\lambda imax$, a wavelength of the light becoming a minimum value in the interference intensity is $\lambda imin$ and a wavelength of the light becoming a maximum in a light intensity in relation to the light emitted from said emissive layer is $\lambda emax$, a relationship of $\lambda imax < \lambda emax$ and $\lambda imin \geq \lambda emax + 70$ nm is satisfied, and
   wherein said light-emitting device has an electrode of and optical transparency on a side from which the light is taken out, and a transparent element with a refractive index of 1.4 to 2.0 provided on a surface of said electrode from which the light is taken out.

* * * * *